United States Patent
Wu et al.

(10) Patent No.: US 12,451,419 B2
(45) Date of Patent: Oct. 21, 2025

(54) WAFER-ON-WAFER CASCODE HEMT DEVICE

(71) Applicant: Taiwan Semiconductor Manufacturing Co., Ltd., Hsinchu (TW)

(72) Inventors: Haw-Yun Wu, Zhubei (TW); Chen-Bau Wu, Zhubei (TW); Jiun-Lei Yu, Zhudong Township (TW); Chun-Lin Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 582 days.

(21) Appl. No.: 17/816,525

(22) Filed: Aug. 1, 2022

(65) Prior Publication Data
US 2023/0343693 A1   Oct. 26, 2023

Related U.S. Application Data

(60) Provisional application No. 63/363,503, filed on Apr. 25, 2022.

(51) Int. Cl.
*H01L 23/498* (2006.01)
*H01L 23/00* (2006.01)
(Continued)

(52) U.S. Cl.
CPC .... *H01L 23/49844* (2013.01); *H01L 23/5386* (2013.01); *H01L 24/11* (2013.01);
(Continued)

(58) Field of Classification Search
CPC ...... H10D 84/05; H10D 30/015; H10D 84/82; H10D 30/47; H10D 64/258; H10D 84/01;
(Continued)

(56) References Cited

U.S. PATENT DOCUMENTS 9,087,854 B1 * 7/2015 Ha ................... H10D 84/401
11,764,760 B1 * 9/2023 Lai ........................ H03K 7/08
327/175

(Continued)

FOREIGN PATENT DOCUMENTS

JP   2013187546 A   9/2013
JP   2015056564 A   3/2015
(Continued)

*Primary Examiner* — Mouloucoulaye Inoussa
(74) *Attorney, Agent, or Firm* — Slater Matsil, LLP

(57) ABSTRACT

A semiconductor device includes a first semiconductor structure including a first high electron mobility transistor (HEMT) device, wherein the first HEMT device includes a first gate, a first source, and a first drain; and a second semiconductor structure stacked above and bonded to the first semiconductor structure, wherein the second semiconductor structure includes a second HEMT device and a third HEMT device, wherein the second HEMT device includes a second gate, a second source, and a second drain that is electrically connected to the first source, wherein the third HEMT device includes a third gate, a third source, and a third drain that is electrically connected to the first gate.

19 Claims, 27 Drawing Sheets

(51) Int. Cl.
*H01L 23/538* (2006.01)
*H01L 25/07* (2006.01)
*H10D 30/01* (2025.01)
*H10D 30/47* (2025.01)
*H10D 64/23* (2025.01)

(52) U.S. Cl.
CPC .............. *H01L 24/16* (2013.01); *H01L 24/19* (2013.01); *H01L 24/25* (2013.01); *H01L 24/32* (2013.01); *H01L 24/73* (2013.01); *H01L 25/071* (2013.01); *H10D 30/015* (2025.01); *H10D 30/47* (2025.01); *H10D 64/258* (2025.01); *H01L 2224/113* (2013.01); *H01L 2224/16145* (2013.01); *H01L 2224/2511* (2013.01); *H01L 2224/2541* (2013.01); *H01L 2224/73204* (2013.01); *H01L 2224/73259* (2013.01); *H01L 2924/13064* (2013.01)

(58) Field of Classification Search
CPC ............... H10D 30/475; H10D 62/343; H10D 62/8503; H10D 62/151; H10D 84/811; H10D 89/10; H10D 62/8325; H01L 24/73; H01L 25/50; H01L 23/5386; H01L 24/29; H01L 25/071; H01L 25/074; H01L 23/49844; H01L 24/25; H01L 24/16; H01L 24/19; H01L 24/11; H01L 24/81; H01L 24/32; H01L 23/36; H01L 23/3107; H01L 21/565; H01L 23/49568; H01L 23/49575; H01L 23/49562; H01L 23/4951; H01L 21/4825; H01L 23/4954; H01L 23/5228; H01L 23/5223; H01L 23/66; H01L 24/05; H01L 21/78; H01L 24/13; H01L 23/3185; H01L 24/03; H01L 23/3135; H01L 25/16; H01L 2224/73204; H01L 2224/73259; H01L 2224/2511; H01L 2224/2541; H01L 2224/16145; H01L 2224/113; H01L 2924/13064; H01L 2224/16245; H01L 2223/6688; H01L 2223/6672; H01L 2224/05166; H01L 2224/81192; H01L 2224/0345; H01L 2924/04941; H03K 17/102; H03K 17/6871; H03K 17/063; H03K 19/0944; H03K 2217/0081; H03B 19/14; H02M 3/07

See application file for complete search history.

(56) References Cited

U.S. PATENT DOCUMENTS

| | | | |
|---|---|---|---|
| 2013/0234207 A1 | 9/2013 | Choi et al. | |
| 2014/0048853 A1* | 2/2014 | Choi | H01L 23/481 257/231 |
| 2015/0021784 A1* | 1/2015 | Lin | H01L 24/92 438/459 |
| 2015/0021785 A1* | 1/2015 | Lin | H01L 21/76897 438/459 |
| 2015/0115324 A1* | 4/2015 | Otremba | H10D 84/08 257/329 |
| 2015/0118781 A1* | 4/2015 | Chen | H10F 39/8053 438/59 |
| 2015/0125995 A1 | 5/2015 | Lee et al. | |
| 2016/0013160 A1* | 1/2016 | Chun | H01L 25/50 257/751 |
| 2016/0380091 A1 | 12/2016 | Okawa | |
| 2018/0145052 A1 | 5/2018 | Dasgupta et al. | |
| 2018/0219008 A1* | 8/2018 | Prechtl | H10D 88/101 |
| 2019/0006352 A1* | 1/2019 | Kobayashi | H10D 62/151 |
| 2019/0279948 A1 | 9/2019 | Moreau et al. | |
| 2020/0105741 A1 | 4/2020 | Lin et al. | |
| 2020/0194427 A1* | 6/2020 | Dewey | H01L 24/17 |
| 2020/0266229 A1* | 8/2020 | Takahashi | H10F 39/018 |
| 2020/0304119 A1* | 9/2020 | Chern | H03K 19/0944 |
| 2021/0098398 A1* | 4/2021 | Yang | H01L 24/05 |
| 2021/0111107 A1* | 4/2021 | Chowdhury | H01L 23/3107 |
| 2021/0375781 A1* | 12/2021 | Lin | H01L 23/544 |
| 2022/0037515 A1 | 2/2022 | Zhang et al. | |
| 2022/0139880 A1* | 5/2022 | Lee | H01L 25/0657 257/621 |
| 2022/0254744 A1 | 8/2022 | Yang et al. | |
| 2023/0188100 A1* | 6/2023 | Fisher | H03F 3/195 330/277 |
| 2023/0282525 A1* | 9/2023 | Wu | H10D 84/08 257/76 |
| 2023/0326890 A1* | 10/2023 | Chang | H01L 25/0657 |
| 2024/0145478 A1* | 5/2024 | Hsueh | H10D 30/015 |

FOREIGN PATENT DOCUMENTS

| | | |
|---|---|---|
| KR | 20170001612 A | 1/2017 |
| KR | 20180021133 A | 2/2018 |
| KR | 20200037089 A | 4/2020 |
| TW | 202021130 A | 6/2020 |
| TW | 202115856 A | 4/2021 |

\* cited by examiner

WAFER-ON-WAFER CASCODE HEMT DEVICE

PRIORITY CLAIM AND CROSS-REFERENCE

This application claims the benefit of U.S. Provisional Application No. 63/363,503, filed on Apr. 25, 2022, which application is hereby incorporated herein by reference.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
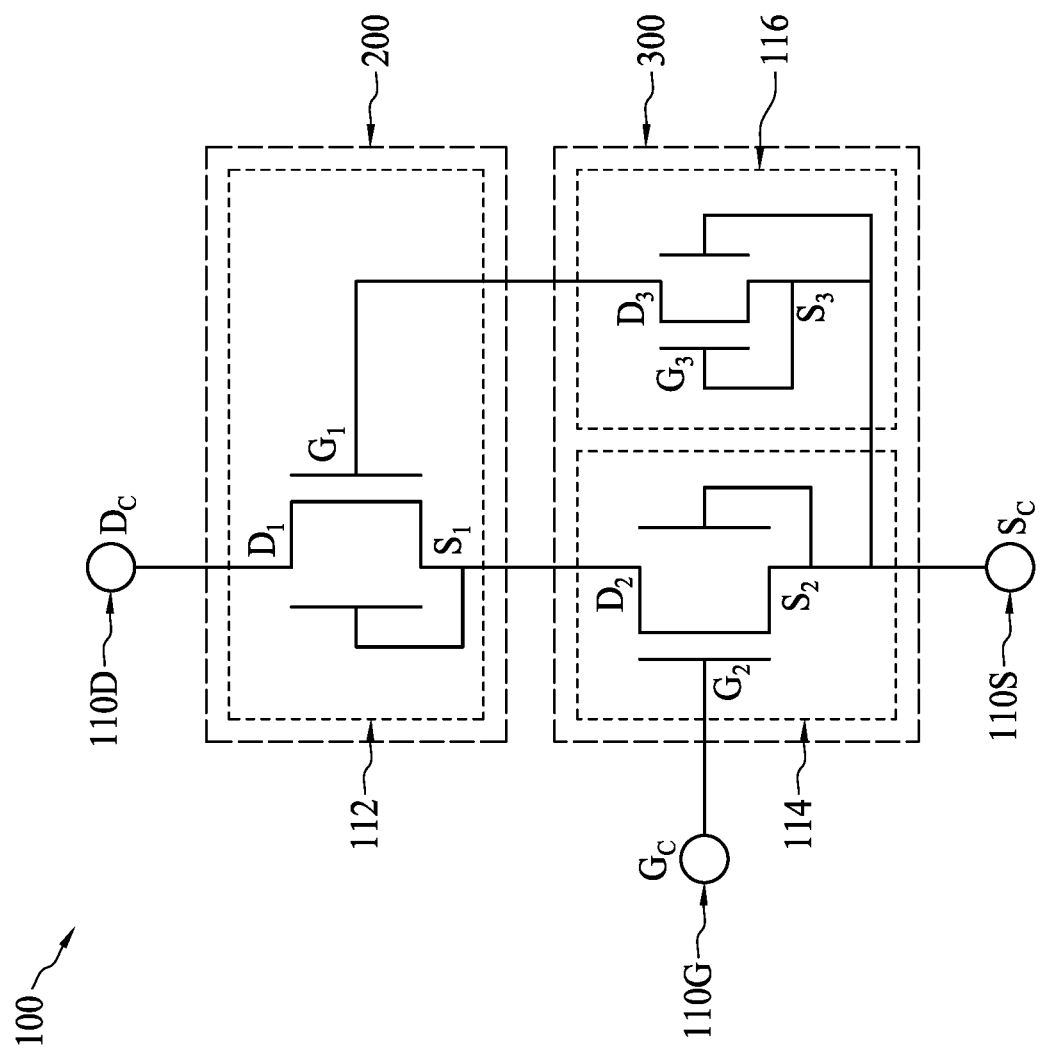
FIG. 1 illustrates a schematic diagram of a cascode high electron mobility transistor (HEMT) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package comprising high electron mobility transistor (HEMT) devices and the formation thereof are described. In some embodiments, the HEMT devices are connected in a cascode configuration (e.g., a "cascode HEMT device"). A cascode HEMT device as described herein can provide functionality similar to that of a single high voltage transistor device having a relatively large breakdown voltage, in some cases. For example, a circuit comprising HEMT devices in a cascode configuration can have an effective breakdown voltage that is larger than the breakdown voltage of any of the individual HEMT devices within the circuit. In this manner, the use of HEMT devices in a cascode configuration as described herein can allow for a larger breakdown voltage without increasing the layer thicknesses of the individual HEMT devices. For example, embodiments described herein may allow for a cascode HEMT device having a breakdown voltage of about 1200 V or greater.

In some embodiments, a die or package comprising a cascode HEMT device is formed by forming HEMT devices in two wafers and then bonding the wafers together to electrically couple the HEMT devices. In some cases, bonding wafers to form a cascode HEMT device can reduce the area of a die or package comprising a cascode HEMT device, since the HEMT devices are arranged vertically rather than horizontally. Additionally, bonding wafers to form a cascode HEMT device as described herein can reduce the lengths or amount of conductive routing required, which can reduce resistance or parasitic inductance. Additionally, the cascode HEMT device as described herein allows for heat dissipation from both the top side and the bottom side, which can improve thermal behavior. In this manner, a cascode HEMT device's efficiency, speed, thermal performance, and power consumption may be improved.

FIG. 1 illustrates a schematic diagram of a cascode high electron mobility transistor (HEMT) device 100, in accordance with some embodiments. The cascode HEMT device 100 comprises a first HEMT device 112 having a first source S1, a first drain D1, and a first gate G1; a second HEMT device 114 having a second source S2, a second drain D2, and a second gate G2; and a third HEMT device 116 having a third source S3, a third drain D3, and a third gate G3. The first HEMT device 112 and the second HEMT device 114 are connected in a cascode configuration. For example, the first HEMT device 112 may be considered a common gate stage and the second HEMT device 114 may be considered a common source stage, with the first source S1 coupled to the second drain D2. The third HEMT device 116 is in a diode-connected configuration and is coupled to the first HEMT device 112 and the second HEMT device 114. For example, the third gate G3 is coupled to the third source S3, the third drain D3 is coupled to the first gate G1, and the third source S3 is coupled to the second source S2. The third HEMT device 116 may be configured, for example, to protect the second HEMT device 114 from high voltages (e.g., high voltages between the first drain D1 and the first gate G1) that may cause damage.

In some embodiments, the first HEMT device 112 may be a depletion-mode device (i.e., a normally-on device), the second HEMT device 114 may be an enhancement mode device (i.e., a normally-off device), and the third HEMT device 116 may be an enhancement mode HEMT device. The HEMT devices 112, 114, or 116 may have similar respective breakdown voltages or different respective breakdown voltages. For example, in some embodiments, the first HEMT device 112 may have a greater breakdown voltage than the second HEMT device 114. Other configurations are possible.

Coupling the first HEMT device 112 and the second HEMT device 114 in a cascode configuration allows the cascode HEMT device 100 to operate in a manner that is similar to a single high-voltage transistor device. For example, the first HEMT device 112 and the second HEMT device 114 are configured to collectively form a common source (SC) terminal 110S of the cascode HEMT device 100, a common drain (DC) terminal 110D of the cascode HEMT device 100, and a common gate (GC) terminal 110G of the cascode HEMT device 100. The cascode HEMT device 100 has a breakdown voltage that is greater than the respective breakdown voltages of either the first HEMT device 112 or the second HEMT device 114. For example, in some embodiments, the first HEMT device 112 and the second HEMT device 114 may have respective breakdown voltages of approximately 650 V, while the cascode HEMT device 100 may have a breakdown voltage of approximately 1200 V. Other breakdown voltages are possible. By using the first HEMT device 112 and the second HEMT device 114 to operate as a single high voltage device as described herein, a cascode HEMT device 100 is able to achieve a high breakdown voltage without using HEMT devices having individually high breakdown voltages, which can reduce the size or the cost of a high voltage device.

In some embodiments, the various HEMT devices may be formed on separate substrates and connected together to couple the various HEMT devices into a single cascode HEMT device 100. For example, as indicated in FIG. 1, the first HEMT device 112 may be formed in a first semiconductor structure 200, and the second HEMT device 114 and the third HEMT device 116 may both formed in a separate second semiconductor structure 300. The first semiconductor structure 200 and the second semiconductor structure 300 may be formed on separate wafers or separate substrates, described in greater detail below. Other configurations of HEMT devices or semiconductor structures are possible.

Figure 2:
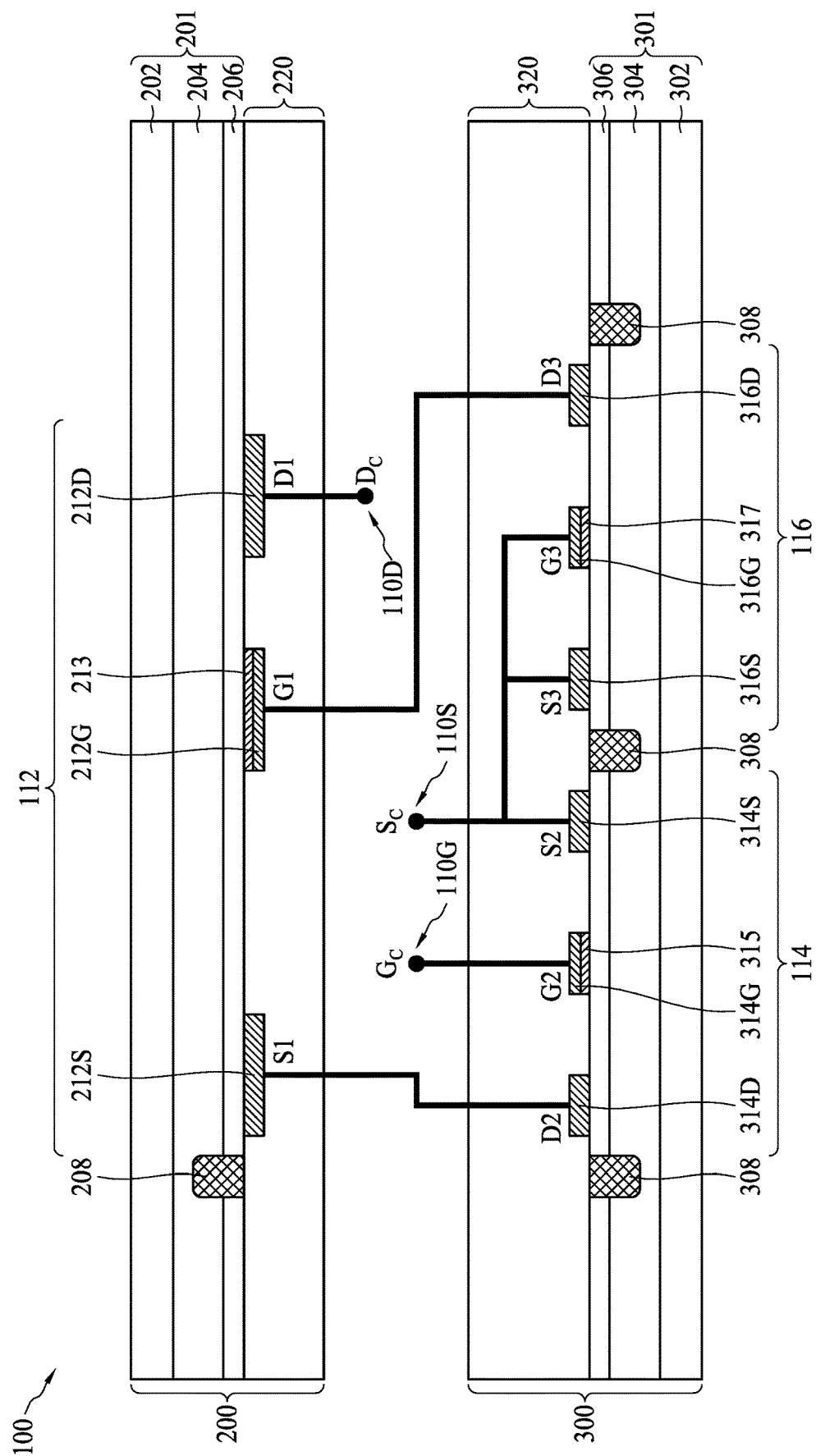
FIG. 2 illustrates a schematic cross-sectional view of a cascode HEMT device, in accordance with some embodiments.

FIG. 2 illustrates a schematic cross-sectional view of a cascode HEMT device 100, in accordance with some embodiments. The cascode HEMT device 100 shown in FIG. 2 may be similar to the cascode HEMT device 100 shown in FIG. 1. It will be appreciated that the cross-sectional view of FIG. 2 is a schematic view shown for explanatory purposes and may not be representative of sizes and/or shapes of some components within the device. Additionally, some features may only be shown schematically or may not be shown.

As shown in FIG. 2, the cascode HEMT device 100 may comprise a first HEMT device 112 formed in a first semiconductor structure 200 that is connected to a second HEMT device 114 and a third HEMT device 116 formed in a second semiconductor structure 300. In some embodiments, the first semiconductor structure 200 may be formed on a first wafer 201 comprising a substrate 202, a channel layer 204 over the substrate 202, and an active layer 206 over the channel layer 204; and the second semiconductor structure 300 may be formed on a second wafer 301 comprising a substrate 302, a channel layer 304 over the substrate 302, and an active layer 306 over the channel layer 304. The substrate 202 and the substrate 302 may be separate substrates, and thus the first wafer 201 and the second wafer 301 may be separate wafers. In some embodiments, the first semiconductor structure 200 and the second semiconductor structure 300 include different device regions that are subsequently singulated. For example, first semiconductor structures 200 and/or second semiconductor structures 300 may be singulated before or after bonding a first semiconductor structure 200 to a second semiconductor structure 300 (see FIG. 10).

The substrate 202 and/or the substrate 302 may be a semiconductor substrate, such as a bulk semiconductor, a semiconductor-on-insulator (SOI) substrate, or the like, which may be doped (e.g., with a p-type or an n-type dopant) or undoped. The substrate 202 and/or the substrate 302 may be a wafer, such as a silicon wafer. Generally, an SOI substrate is a layer of a semiconductor material formed on an insulating layer. The insulating layer may be, for example, a buried oxide (BOX) layer, a silicon oxide layer, or the like. The insulating layer is provided on a substrate, typically a silicon or glass substrate. Other substrates, such as a multi-layered or gradient substrate may also be used. In some embodiments, the semiconductor material of the substrate 202 and/or the substrate 302 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The channel layer 204 and the active layer 206 may comprise different semiconductor materials with different bandgaps such that a heterojunction is formed between the channel layer 204 and the active layer 206. For example, the semiconductor material of the channel layer 204 may have a smaller bandgap than the semiconductor material of the active layer 206. The heterojunction forms a two-dimensional electron gas (2DEG) by confining electrons to a quantum well along the interface between the channel layer 204 and the active layer 206. For example, the channel layer 204 may comprise gallium nitride (GaN) or the like, and the active layer 206 may comprise aluminum gallium nitride (AlGaN) or the like. Similarly, the channel layer 304 and the active layer 306 may comprise semiconductor materials that form a heterojunction. The semiconductor materials of the first wafer 201 may be similar or different from the semiconductor materials of the second wafer 301.

In some cases, a HEMT device's breakdown voltage depends on the thickness of its channel layer. For example, a HEMT device with a relatively thicker channel layer may have a correspondingly larger breakdown voltage. However, in some cases, forming a thick channel layer (e.g., having a thickness of about 5 μm or greater) may increase manufacturing costs or may result in a channel layer having a greater concentration of defects. Coupling the first HEMT device 112 and the second HEMT device 114 to form a cascode HEMT device 100 as described herein can allow for the HEMT devices 112/114 to be formed with relatively thin channel layers 204/304 (e.g., having thicknesses of about 5 μm or less) while still achieving a high breakdown voltage for the cascode HEMT device 100.

Other semiconductor materials are possible. For example, in other embodiments, the channel layers 204/304 and the active layers 206/306 may comprise III-V semiconductor materials, such as gallium arsenide (GaAs), gallium antimonide (GaSb), or the like. In some embodiments (not shown), a buffer layer may be disposed between the channel layer 204/304 and the corresponding active layer 206/306 to reduce the effects of lattice mismatch. In some embodiments, the buffer layer may comprise aluminum nitride (AlN) or the like, though other materials are possible.

Still referring to FIG. 2, one or more isolation regions 208 may be formed in the first wafer 201 and one or more isolation regions 308 may be formed in the second wafer 301, in accordance with some embodiments. The isolation regions 208/308 may provide electrical isolation for the HEMT devices 112/114/116. For example, isolation regions 308 in the second wafer 301 may provide electrical isolation between the second HEMT device 114 and the third HEMT device 116, in some embodiments. In some embodiments, the isolation regions 208 are disposed within the channel layer 204 and the active layer 206, and the isolation regions 308 are disposed within the channel layer 304 and the active layer 306. In some embodiments, the isolation regions 208/308 may comprise doped regions (e.g., having fluorine dopants, oxygen dopants, or the like). In other embodiments, the isolation regions 208/308 may comprise an insulating material (e.g., a dielectric material or the like). In some cases, the isolation regions 208/308 may be shallow trench isolation (STI) structures or the like.

The first HEMT device 112, the second HEMT device 114, and the third HEMT device 116 each respectively comprise a source contact, a drain contact, and a gate contact. Each gate contact is formed on a respective gate structure, which is disposed between the source and drain contacts. For example, the first HEMT device 112 has a source contact 212S which corresponds to the first source S1, a drain contact 212D which corresponds to the first drain D1, and a gate contact 212G over a gate structure 213 which collectively correspond to the first gate G1; the second HEMT device 114 has a source contact 314S which corresponds to the second source S2, a drain contact 314D which corresponds to the second drain D2, and a gate contact 314G over a gate structure 315 which collectively correspond to the second gate G2; and the third HEMT device 116 has a source contact 316S which corresponds to the third source S3, a drain contact 316D which corresponds to the third drain D3, and a gate contact 316G over a gate structure 317 which collectively correspond to the third gate G3. In some embodiments, a distance from the gate to the drain of an HEMT device 112/114/116 may be in the range of about 15 μm to about 20 μm, though other distances are possible.

In some embodiments, the gate structure (e.g., 213, 315, or 317) of each HEMT device 112/114/116 comprises one or more layers of dielectric material(s) and/or semiconductor material(s). For example, a gate structure may comprise one or more layers of dielectric material(s) such as an oxide, a nitride, or the like, or may comprise one or more layers of semiconductor material(s) such as gallium nitride (e.g., p-doped GaN) or the like. In some embodiments, a gate electrode is formed over the gate structure. The gate electrode may comprise a metal (e.g., aluminum, titanium, copper, tungsten, tantalum, or the like), doped polysilicon, the like, or a combination thereof. In some embodiments, the gate contact (e.g., 212G, 314G, or 316G) may function as the gate electrode. The gate structures 213/315/317 of the HEMT devices 112/114/116 may be similar or different. As an example, for embodiments in which the second HEMT device 114 and the third HEMT device 116 are enhancement mode devices, the gate structure 315 of the second HEMT device 114 and the gate structure 317 of the third HEMT device 116 may each comprise a doped layer of a semiconductor material. For embodiments in which the first HEMT device 112 is a depletion mode device, the gate structure 213 of the first HEMT device 112 may comprise a dielectric layer. In other embodiments, each of the three gate structures 213/315/317 may comprise a doped layer of semiconductor material. Other combinations are possible.

In some embodiments, the first semiconductor structure 200 comprises a first interconnect structure 220 over the first wafer 201, and the second semiconductor structure 300 comprises a second interconnect structure 320 over the second wafer 301. The interconnect structures 220/320 may each comprise multiple layers of dielectric material and multiple layers of conductive features. The conductive features may include, for example, metallization patterns, redistribution layers, conductive lines, conductive vias, interconnect layers, metal routing, or the like. The first interconnect structure 220 covers the active layer 206 of the first wafer 201, and provides electrical connections to the source contact 212S of the first source S1, to the drain contact 212D of the first drain D1, and to the gate contact 212G of the first gate G1.

The second interconnect structure 320 covers the active layer 306 of the second wafer 301, and provides electrical connections to the source contact 314S of the second source D2, to the drain contact 314D of the second drain S2, to the gate contact 314G of the second gate G2, to the source contact 316S of the third source S3, to the drain contact 316D of the third drain D3, and to the gate contact 316G of the third gate G3.

Figure 8A:
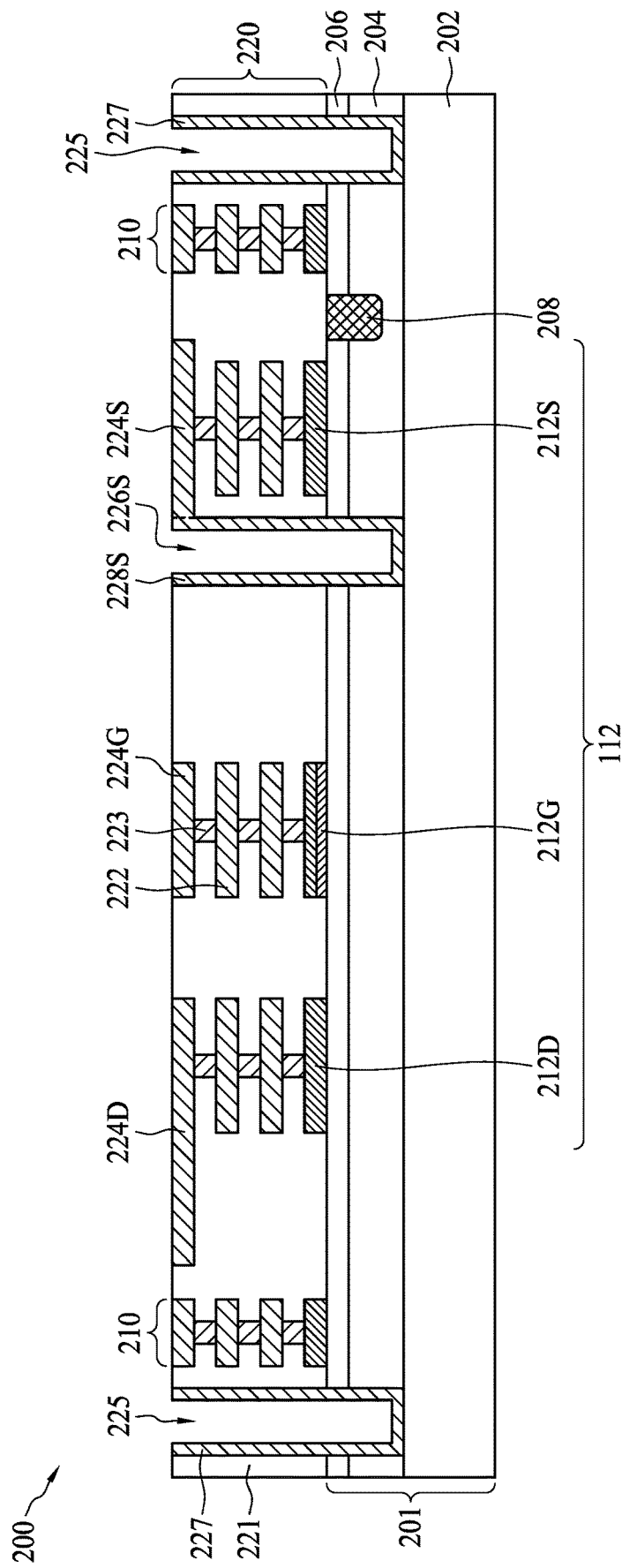
Figure 8B:
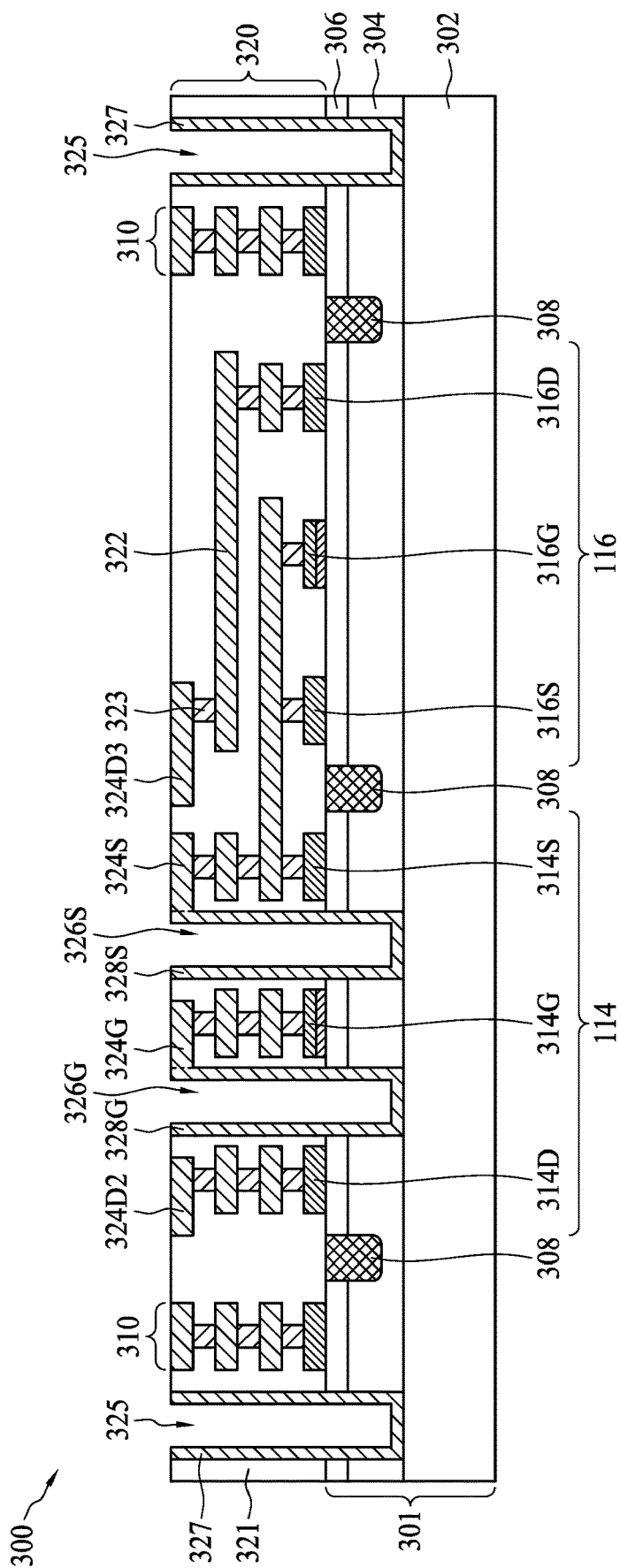
Figure 9A:
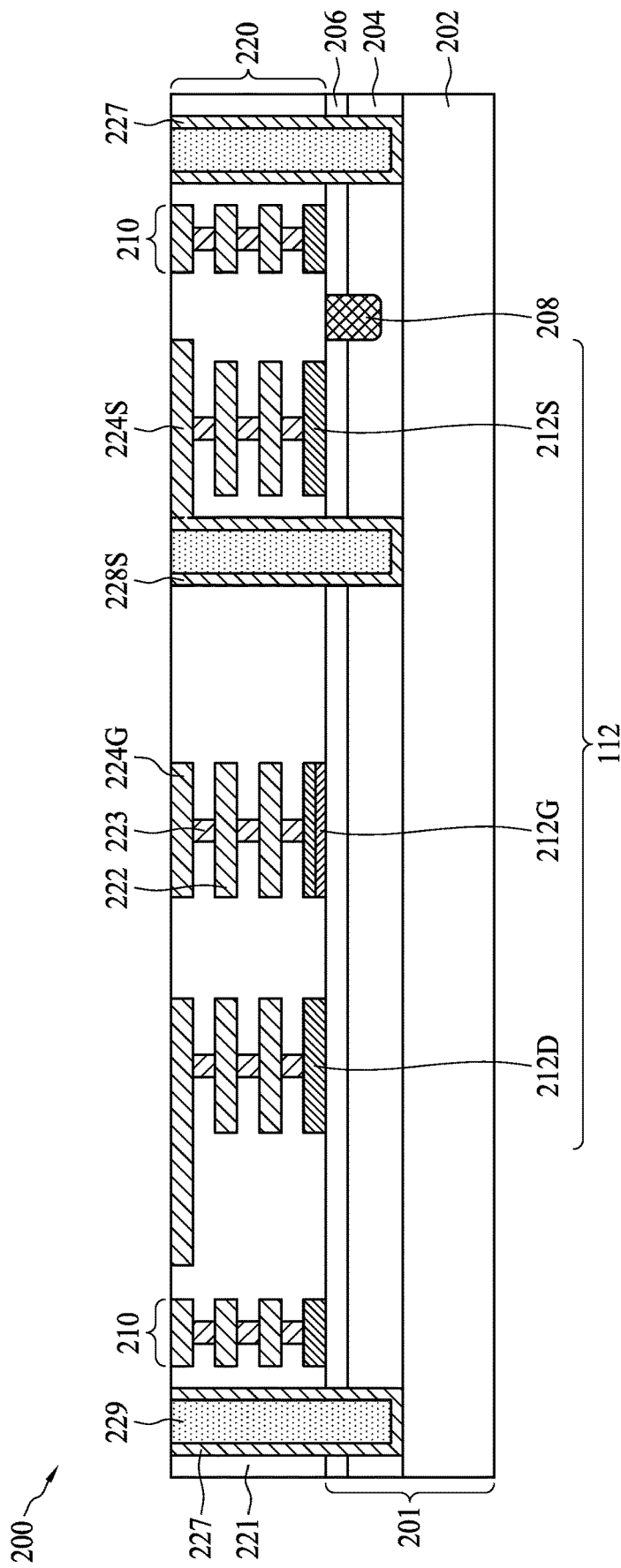
Figure 9B:
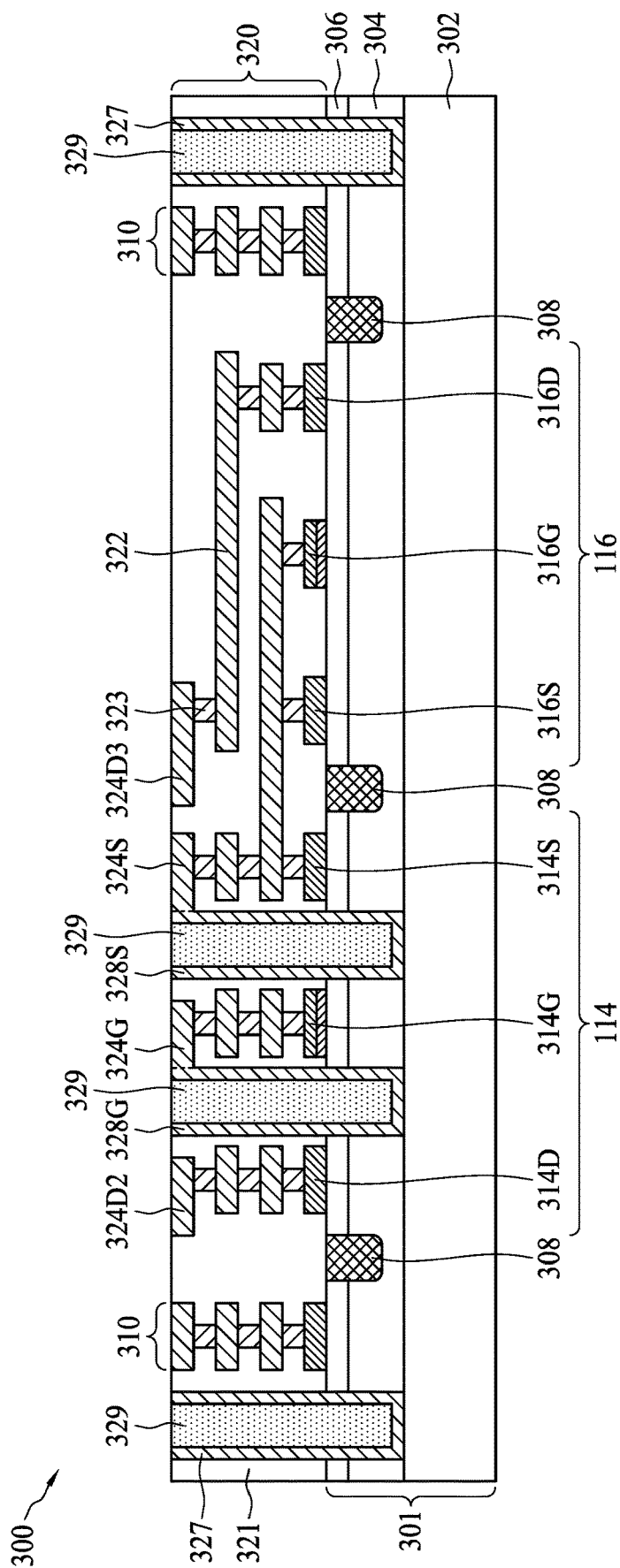
Figure 10:
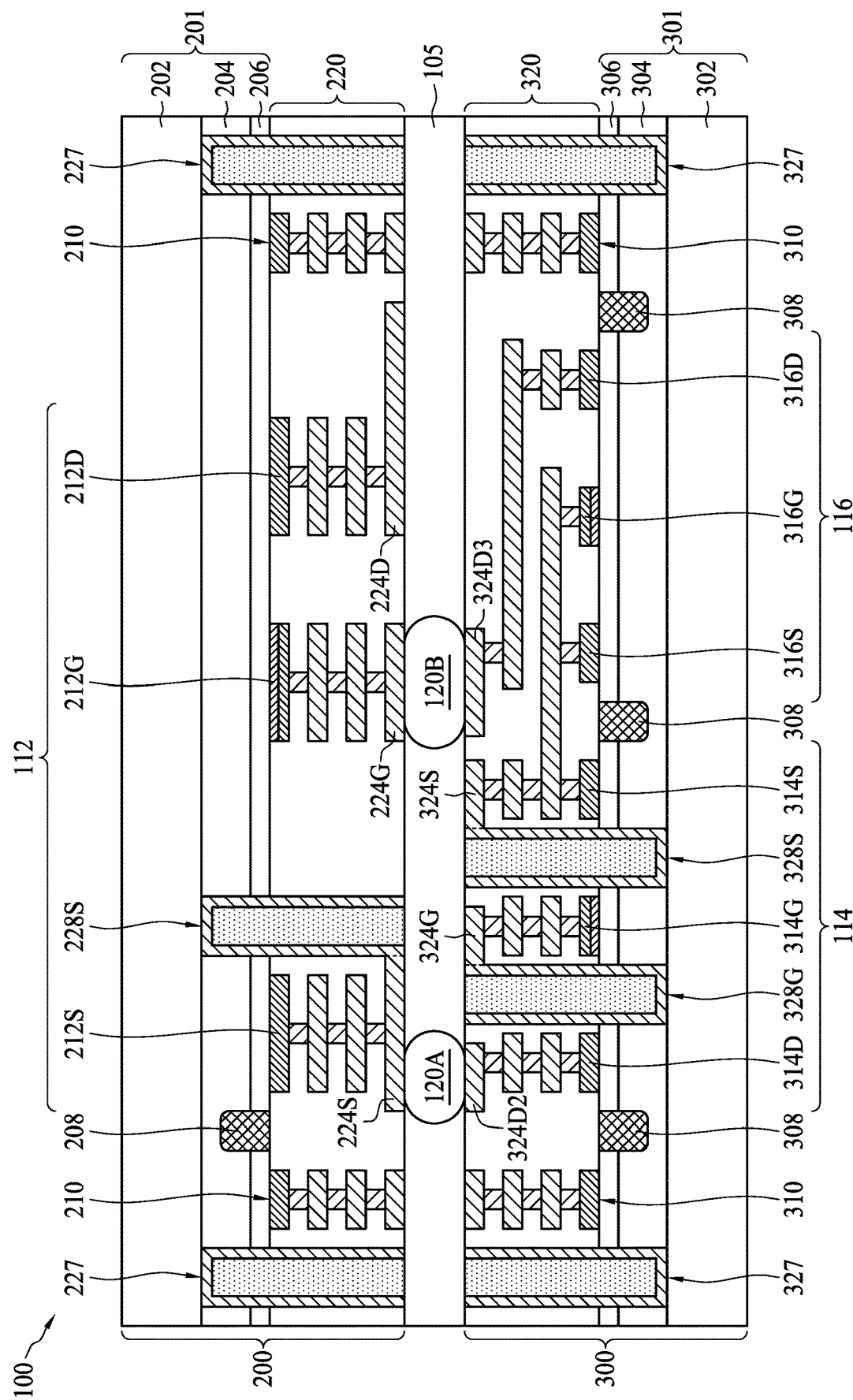
FIGS. 10 and 11 illustrate intermediate steps in the formation of a cascode HEMT device, in accordance with some embodiments.
Figure 11:
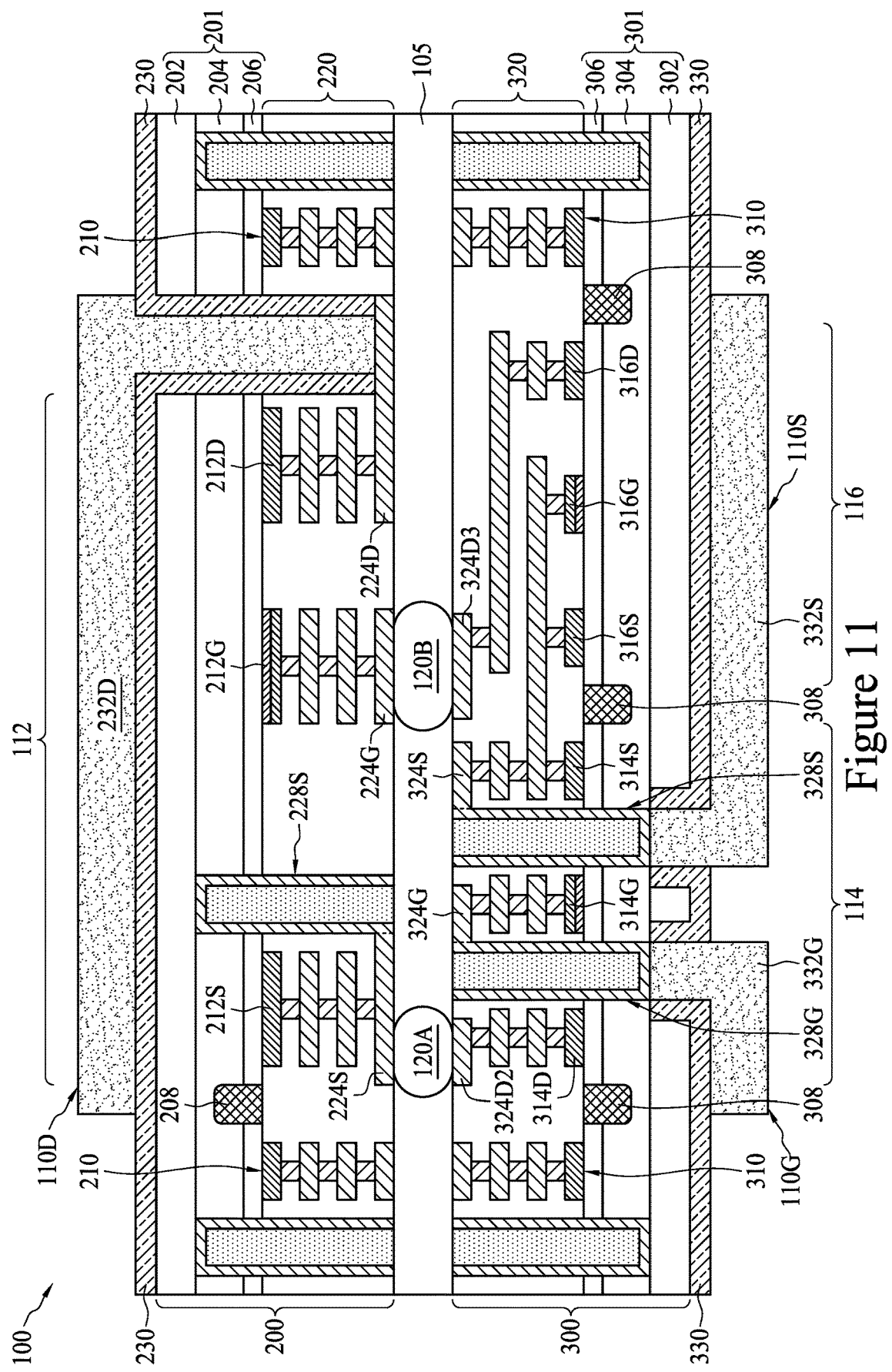

FIGS. 3A through 11 illustrate cross-sectional views of intermediate steps in the formation of a cascode HEMT device 100 (see FIG. 11), in accordance with some embodiments. The cascode HEMT device 100 may be similar to the cascode HEMT device 100 shown in FIG. 1 or the cascode HEMT device 100 shown in FIG. 2. For example, the cascode HEMT device 100 may include a first HEMT device 112 formed in a first semiconductor structure 200 that is electrically connected to a second HEMT device 114 and a third HEMT device 116 that are formed in a second semiconductor structure 300. FIGS. 3A, 4A, 5A, 6A, 7A, 8A, and 9A illustrate cross-sectional views of intermediate steps in the formation of the first semiconductor structure 200, and FIGS. 3B, 4B, 5B, 6B, 7B, 8B, and 9B illustrate cross-sectional views of intermediate steps in the formation of the second semiconductor structure 300, in accordance with some embodiments. FIGS. 10 and 11 illustrate cross-sectional views of intermediate steps in the formation of a cascode HEMT device 100 after the first semiconductor structure 200 is bonded to the second semiconductor structure 300, in accordance with some embodiments.

The first semiconductor structure 200 and the second semiconductor structure 300 may be formed separately using separate process steps, though in some cases the formation of the first semiconductor structure 200 and the second semiconductor structure 300 may share some of the same process steps. The process described in FIGS. 3A-11 for forming a cascode HEMT device 100 is a non-limiting example, and other process steps for forming a cascode HEMT device 100 are possible. Additionally, cross-sectional views shown in FIGS. 3A-11 are intended as illustrative examples, and the arrangement, configuration, or dimensions of the features may be different in other embodiments. For example, in other embodiments, some of the features shown in the cross-sectional views of FIGS. 3A-11 may not be shown by a single cross-sectional view. In other words, in other embodiments, some features may be formed in different cross-sections than shown in FIGS. 3A-11. By forming the HEMT devices 112/114/116 in bonded semiconductor structures 200/300 as described herein, the area of a cascode HEMT device 100 may be reduced and the electrical connections between the HEMT devices 112/114/116 may be improved.

Figure 3A:
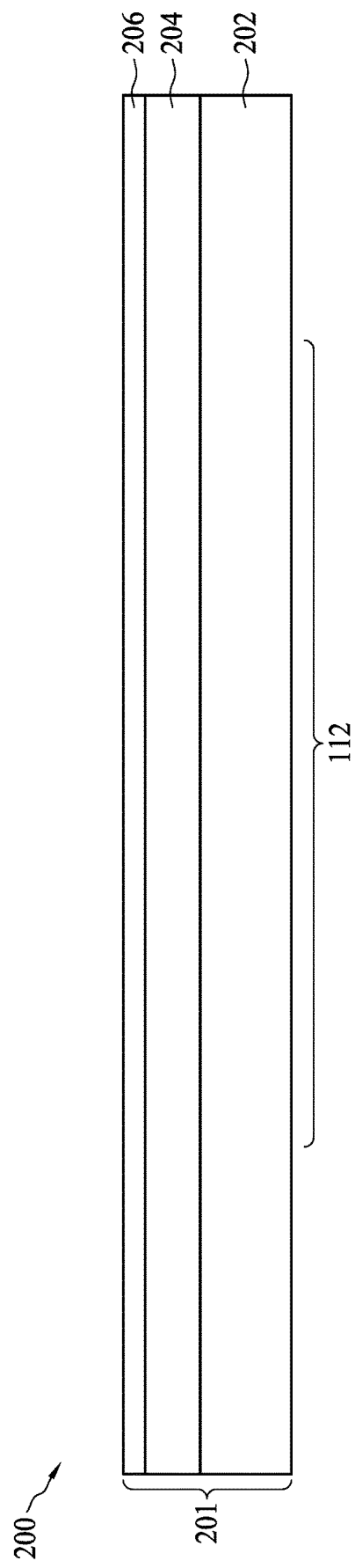
FIGS. 3A, 3B, 4A, 4B, 5A, 5B, 6A, 6B, 7A, 7B, 8A, 8B, 9A, and 9B illustrate cross-sectional views of intermediate steps in the formation of a first semiconductor structure and a second semiconductor structure of a cascode HEMT device, in accordance with some embodiments.
Figure 3B:
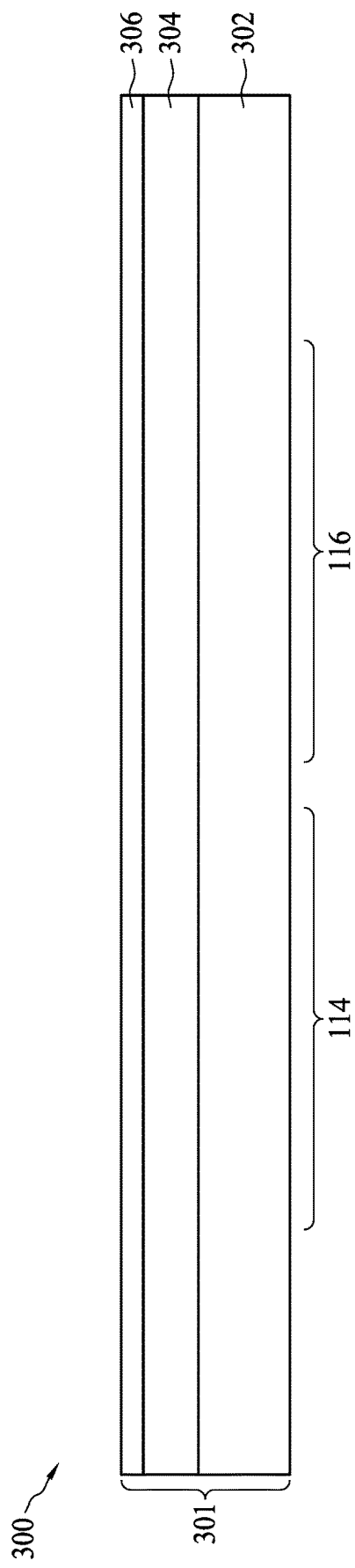

FIGS. 3A and 3B illustrate cross-sectional views of a first wafer 201 and a second wafer 301, respectively, in accordance with some embodiments. The first wafer 201 and the second wafer 301 may be similar to the first wafer 201 and the second wafer 301 described previously for FIG. 2. For example, the first wafer 201 may comprise a channel layer 204 and an active layer 206 formed on a substrate 202; and the second wafer 301 may comprise a channel layer 304 and an active layer 306 formed on a substrate 302. The first HEMT device 112 is subsequently formed on the first wafer 201, and FIG. 3A indicates the approximate region of the first wafer 201 where the first HEMT device 112 is formed. The second HEMT device 114 and the third HEMT device 116 are subsequently formed on the second wafer 301, and FIG. 3B indicates the approximate regions of the second wafer 301 where the second HEMT device 114 and the third HEMT device 116 are formed. The materials or thicknesses of the various layers of the first wafer 201 and the second wafer 301 may be similar or different. The characteristics of the various layers may depend on the characteristics of the subsequently-formed HEMT devices 112/114/116. The various layers of the first wafer 201 and the second wafer 301 may be formed using suitable techniques, which may include, for example, chemical vapor deposition (CVD), plasma enhanced chemical vapor deposition (PECVD), atomic layer deposition (ALD), physical vapor deposition (PVD), or the like.

Figure 4A:
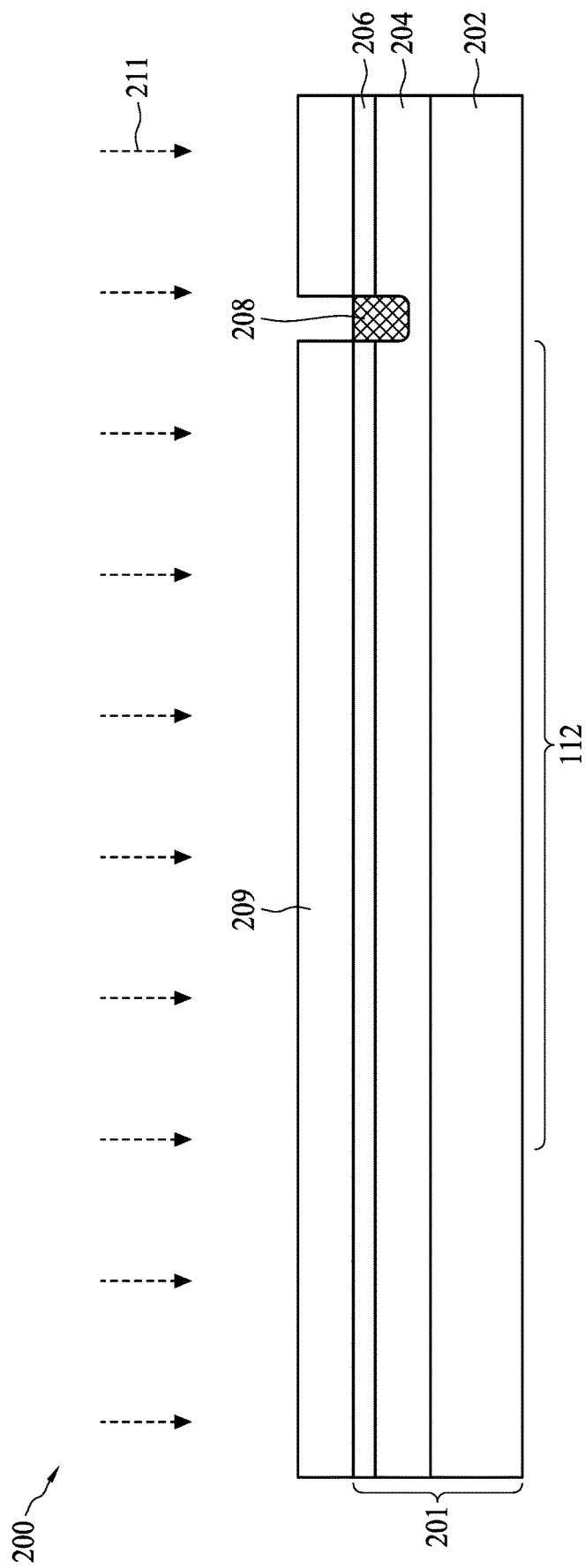
Figure 4B:
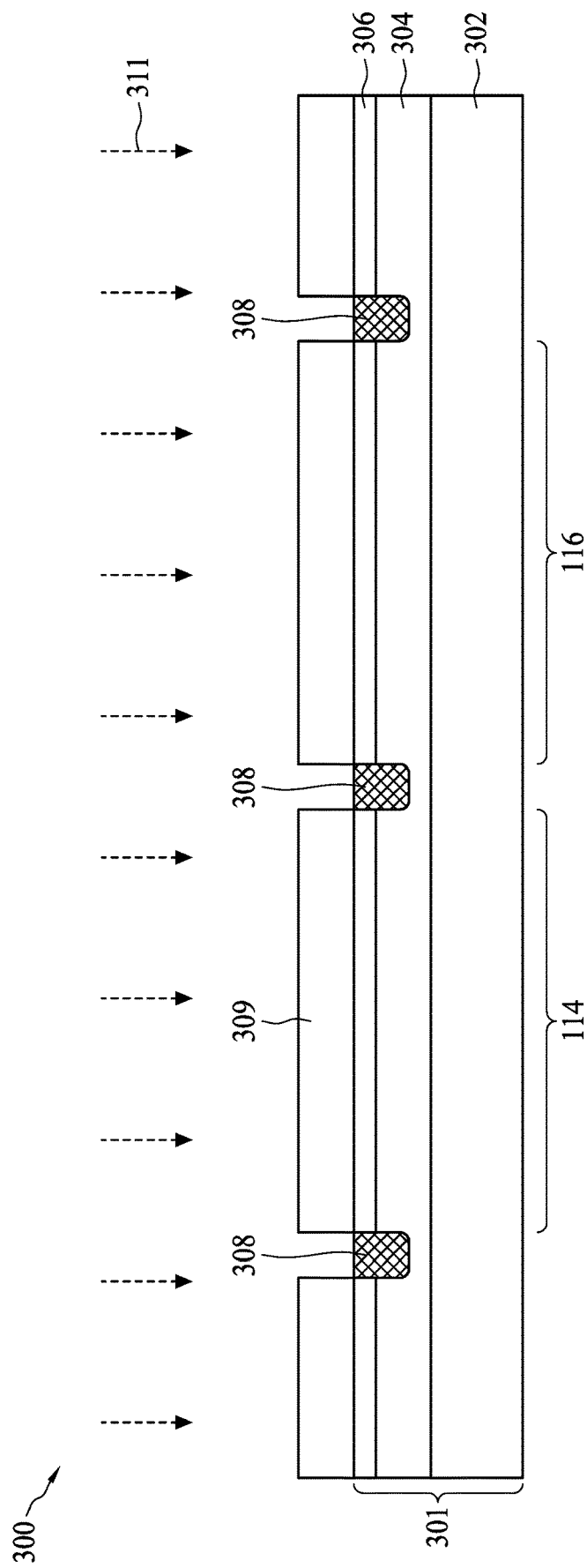

Turning to FIGS. 4A and 4B, isolation regions 208 may be formed in the first wafer 201 and isolation regions 308 may be formed in the second wafer 301, in accordance with some embodiments. The isolation regions may be, for example, doped regions that extend from a top surface of the active layer to within the channel layer. For example, the isolation regions 208 may penetrate through the active layer 206 and may extend partially or fully through the channel layer 204, and the isolation regions 308 may penetrate through the active layer 306 and may extend partially or fully through the channel layer 304. The isolation regions may partially or fully surround the subsequently-formed HEMT devices 112/114/116 to provide electrical isolation. For example, one or more isolation regions 308 may be laterally positioned between the second HEMT device 114 and the third HEMT device 116.

In some embodiments, the isolation regions 208/308 may be formed by respectively forming a patterned mask 209/309 over the active layer 206/306 and performing an implantation process 211/311. For example, suitable photolithography processes and materials may be used to form the patterned mask 209 over the active layer 206 and to form the patterned mask 309 over the active layer 306. In some embodiments, each patterned mask 209/309 may be formed by depositing a mask material (e.g., a hard mask material, a photoresist material, or the like) using a suitable technique, and then patterning openings in the mask material using a suitable photolithography technique. The openings in each patterned mask 209/309 expose portions of the active layer 206/306 corresponding to the locations of the isolation regions 208/308. An implantation process 211/311 may then be performed to implant dopants into the exposed portions of the active layer 206/306. In some embodiments, the dopants may comprise oxygen, fluorine, the like, or a combination thereof. In some embodiments, the implantation process 211/311 may have sufficient energy to drive the dopants into the channel layer 204/304. In some embodiments, a drive-in anneal process may be performed to diffuse the dopants after performing the implantation process 211/311. After performing the implantation process 211/311, the patterned mask 209/309 may be removed using a suitable ashing process, etching process, or the like. Other dopants, process steps, or techniques for forming the isolation regions 208/308 are possible.

Figure 5A:
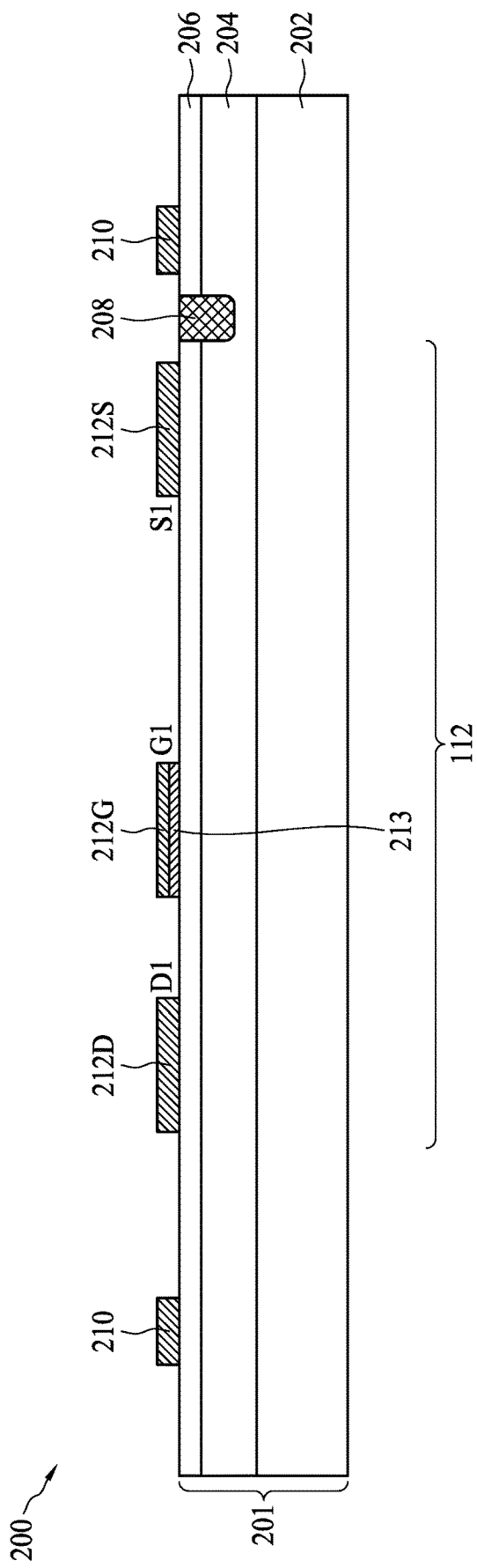
Figure 5B:
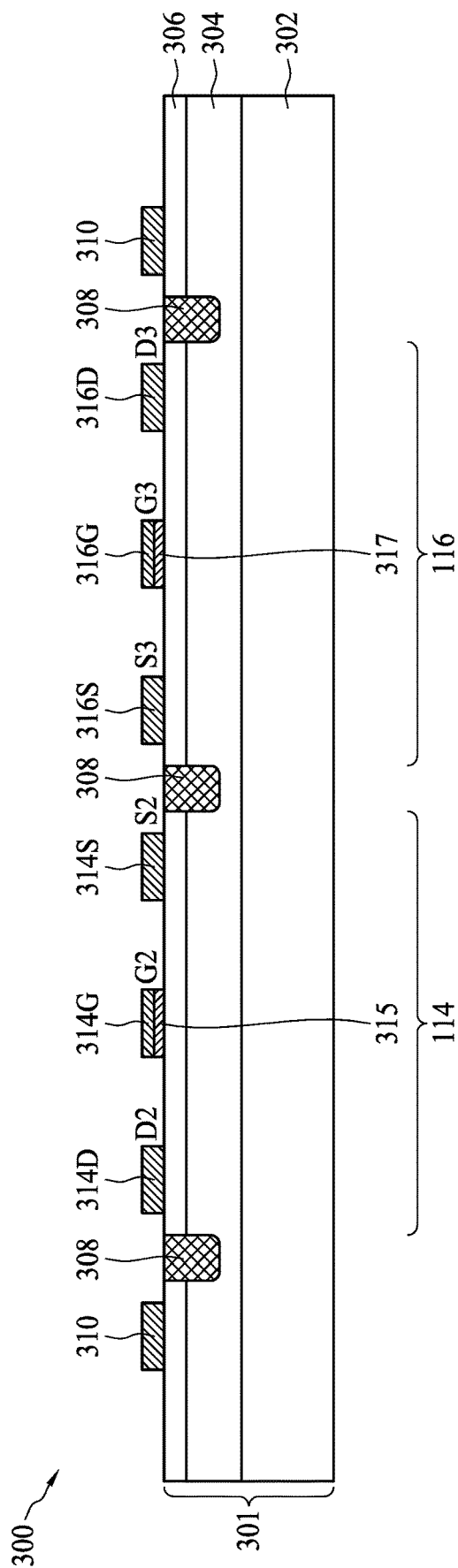

In FIGS. 5A and 5B, source contacts, drain contacts, gate structures, and gate contacts of the HEMT devices are formed, in accordance with some embodiments. The source contact 212S, the drain contact 212D, the gate structure 213, and the gate contact 212G of the first HEMT device 112 may be formed on the first wafer 201. As an example, in some embodiments, the gate structure 213 of the first HEMT device 112 is formed by depositing a gate structure material over the active layer 206 of the first wafer 201 and then patterning the gate structure material to form the gate structure 213. In some embodiments, the gate structure material for the gate structure 213 may be, for example, a dielectric layer deposited using a suitable technique. The gate structure material may then be patterned using suitable photolithography and etching techniques, with remaining portions of the gate structure material forming the gate structure 213. In other embodiments, the gate structure 213 may be formed by first forming a patterned mask over the active layer 206 and then depositing the gate structure material over the patterned mask and exposed portions of the active layer 206.

After forming the gate structure 213, a conductive material may be deposited and patterned to form the source contact 212S, the drain contact 212D, and the gate contact 212G, in accordance with some embodiments. The conductive material may comprise a metal (e.g., aluminum, titanium, copper, tungsten, tantalum, or the like), doped polysilicon, the like, or a combination thereof. The conductive material may be deposited over the active layer 206 and the gate structure 213 using a suitable technique, such as CVD, PECVD, ALD, PVD, plating, or the like. After depositing the conductive material, the conductive material may be patterned using suitable photolithography and etching techniques. For example, a photoresist may be deposited over the conductive material and patterned, with the pattern corresponding to the source contact 212S, the drain contact 212D, and the gate contact 212G. A suitable etching process (e.g., a wet etch and/or a dry etch) may then be performed. After performing the etching process, remaining portions of the conductive material on the active layer 206 form the source contact 212S and the drain contact 212D, and remaining portions of the conductive material on the gate structure 213 form the gate contact 212G. This is an example, and other materials or techniques are possible. For example, in other embodiments, a dielectric layer of the first interconnect structure 220 may be deposited over the active layer 206 and the gate structure 213 and patterned to form openings therein, and then the conductive material may be deposited into the openings. The gate contact 212G and its underlying gate structure 213 may have the same width (e.g., may have coterminous sidewalls) or may have different widths. In some embodiments, the process steps that form the source contact 212S, the drain contact 212D, and the gate contact 212G also form portions of one or more seal ring structures 210, described in greater detail below for FIG. 6A.

The source contact 314S, the drain contact 314D, the gate structure 315, and the gate contact 314G of the second HEMT device 114 and the source contact 316S, the drain contact 316D, the gate structure 317, and the gate contact 316G of the third HEMT device 116 may be formed on the second wafer 301. In some embodiments, the contacts and gate structures of the second HEMT device 114 and the third HEMT device 116 are formed using some materials and/or techniques that are similar to those used to form the contacts and gate structure of the first HEMT device 112. For example, in some embodiments, the gate structure 315 of the second HEMT device 114 and the gate structure 317 of the third HEMT device 116 may be formed by depositing a gate structure material over the active layer 306 of the second wafer 301 and then patterning the gate structure material using suitable photolithography and etching techniques. In some embodiments, the gate structure material for the gate structure 315 and the gate structure 317 may be, for example, a semiconductor material deposited using a suitable technique.

After forming the gate structures 315/317, the source contacts 314S/316S, the drain contacts 314D/316D, and the gate contacts 314G/316G may be formed, for example, by depositing a conductive material over the active layer 306 and the gate structures 315/317 and then patterning the conductive material using suitable photolithography and etching techniques.

The remaining portions of the conductive material on the active layer 306 form the source contacts 314S/316S and the drain contacts 314D/316D, remaining portions of the conductive material on the gate structure 315 form the gate contact 314G, and remaining portions of the conductive material on the gate structure 317 form the gate contact 316G. This is an example, and other materials or techniques are possible. The gate contacts 314G/316G and the respective underlying gate structures 315/317 may have the same width (e.g., may have coterminous sidewalls) or may have different widths. In some embodiments, the process steps that form the source contacts 314S/316S, the drain contacts 314D/316D, and the gate contacts 314G/316G also form portions of one or more seal ring structures 310, described in greater detail below for FIG. 6B.

Figure 6A:
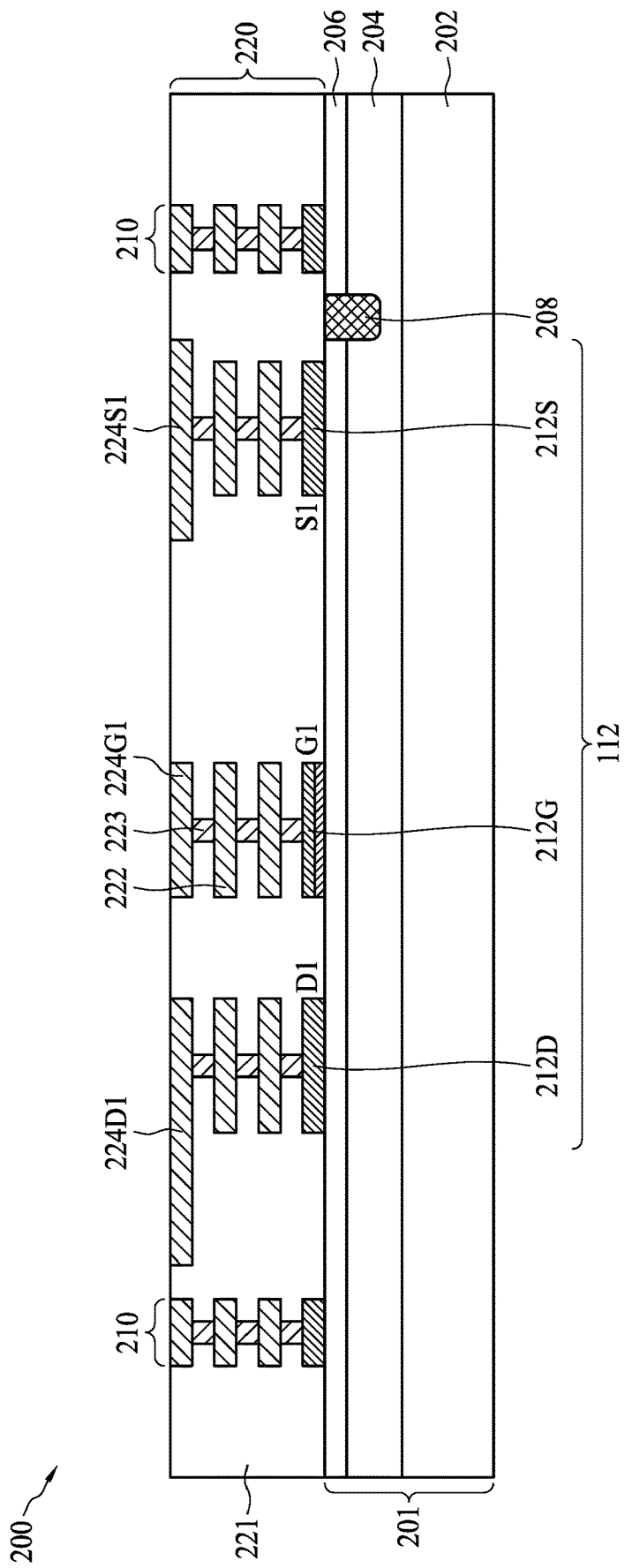
Figure 6B:
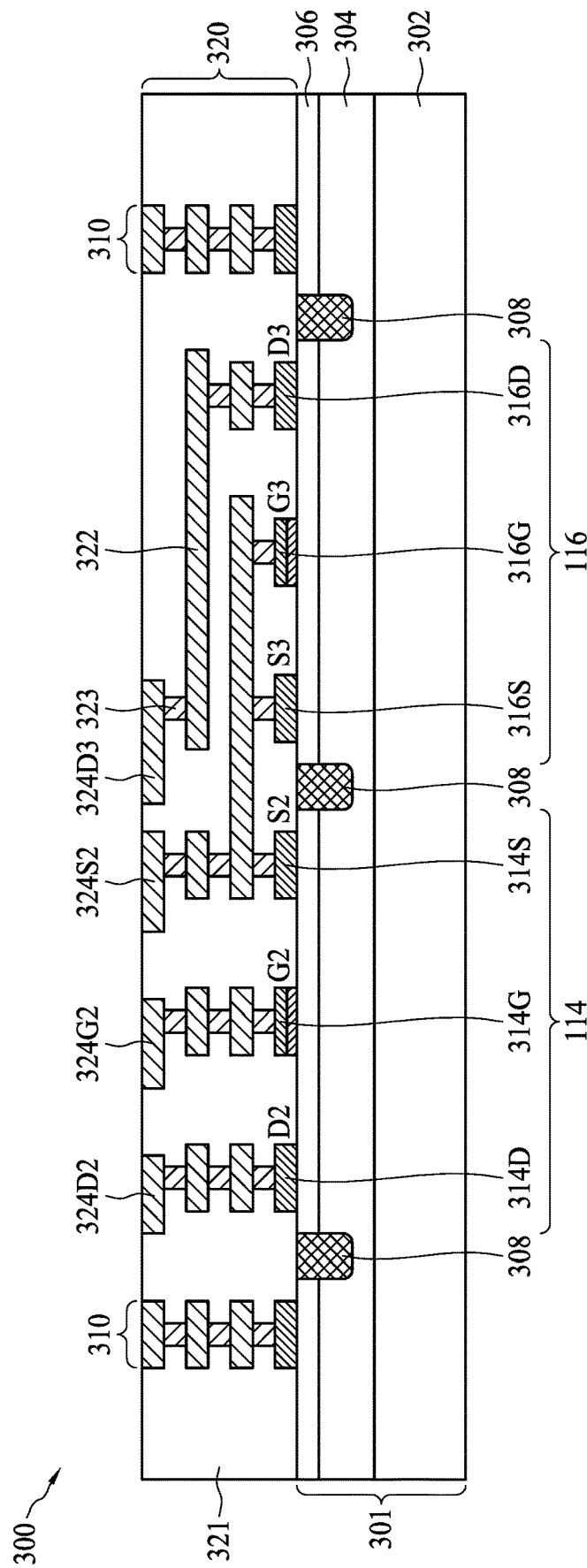

In FIGS. 6A and 6B, a first interconnect structure 220 is formed over the first wafer 201 and a second interconnect structure 320 is formed over the second wafer 301, in accordance with some embodiments. The interconnect structures 220/320 each include one or more dielectric layers and one or more layers of conductive features (e.g., metallization patterns or the like). For example, the first interconnect structure 220 may include conductive features such as conductive lines 222, conductive vias 223, conductive pads 224, or the like formed in dielectric layers 221, and the second interconnect structure 320 may include conductive features such as conductive lines 322, conductive vias 323, conductive pads 324, or the like formed in dielectric layers 321. The conductive features of the interconnect structures 220/320 may also include seal ring structures 210/310, described in greater detail below. The interconnect structures 220/320 shown in FIGS. 6A-6B are examples, and interconnect structures 220/320 may have other numbers, configurations, or arrangements of conductive features or dielectric layers 221/321 in other embodiments.

The dielectric layers 221/321 of the interconnect structures 220/320 may be, for example, inter-layer dielectric (ILD) layers and/or inter-metallization dielectric (IMD) layers. In some embodiments, the dielectric layers 221/321 are formed of a dielectric material (which may be a low-k dielectric material), such as phosphosilicate glass (PSG), borophosphosilicate glass (BPSG), fluorosilicate glass (FSG), silicon oxide, silicon nitride, silicon oxycarbide, silicon carbon, spin-on glass (SOG), polymer(s), molding compound, combinations thereof, or the like. The dielectric layers 221/321 may be formed using any suitable techniques, such as spin-on, CVD, PECVD, ALD, or the like.

In some embodiments, etch stop layers (not shown) may be formed between (e.g., "sandwiched between") adjacent dielectric layers of the dielectric layers 221/321. The etch stop layers may be formed from a dielectric material that has a different etching selectivity than adjacent layers (e.g., the overlying and underlying dielectric layers). In some embodiments, the etch stop layers are formed of a material such as silicon nitride, silicon carbonitride, silicon oxycarbide, titanium oxide, tantalum oxide, the like, or a combination thereof. The etch stop layers may be formed using a suitable technique, such as CVD, PECVD, ALD, or the like.

The conductive lines 222/322 and conductive vias 223/323 within the interconnect structures 220/320 provide electrical connections to the HEMT devices 112/114/116. As shown in FIG. 6A, the conductive lines 222 and conductive vias 223 of the first interconnect structure 220 make electrical connections to the source contact 212S, the drain contact 212D, and the gate contact 212G of the first HEMT device 112. As shown in FIG. 6B, the conductive lines 322 and conductive vias 323 of the second interconnect structure 320 make electrical connections to the source contact 314S, the drain contact 314D, and the gate contact 314G of the second HEMT device 114 and to the source contact 316S, the drain contact 316D, and the gate contact 316G of the third HEMT device 116. As shown in FIG. 6B, the conductive lines 322 and conductive vias 323 in the second interconnect structure 320 also interconnect the second HEMT device 114 and the third HEMT device 116. For example, the source contact 314S of the second HEMT device 114 is electrically connected to the source contact 316S and to the gate contact 316G of the third HEMT device 116.

The conductive pads 224/324 are conductive features at the top surfaces of each interconnect structure 220/320 that are electrically connected to conductive lines 222/322 and/or conductive vias 223/323 of the interconnect structure 220/320. The conductive pads 224/324 allow for electrical connections to be made to the interconnect structures 220/320, such as electrical connections between the first interconnect structure 220 and the second interconnect structure 320 (see FIG. 10) or electrical connections to conductive pads 224/324 (see FIGS. 9A-9B). The first interconnect structure 220 includes, for example, a conductive pad 224S1 that is electrically connected to the source contact 212S; a conductive pad 224D1 that is electrically connected to the drain contact 212D; and a conductive pad 224G1 that is electrically connected to the gate contact 212G. The second interconnect structure 320 includes, for example, a conductive pad 324D2 that is electrically connected to the drain contact 314D; a conductive pad 324G2 that is electrically connected to the gate contact 314G; a conductive pad 324D3 that is electrically connected to the drain contact 316D; and a conductive pad 324S2 that is electrically connected to the source contact 314S, the source contact 316S, and the gate contact 316G. Other configurations of conductive pads 224/324 are possible.

The conductive features (e.g., conductive lines, conductive vias, conductive pads, or the like) may be formed using any suitable process, such as a damascene process, a dual damascene process, or the like. In some embodiments, the conductive features comprise a conductive material formed over a liner. The liner may be, for example, a barrier layer, an adhesion layer, or the like. The liner may comprise, for example, tantalum, tantalum nitride, titanium, titanium nitride, cobalt tungsten, the like, or a combination thereof. The conductive material may comprise a conductive material such as copper, tungsten, aluminum, silver, combinations thereof, or the like. Other materials or formation techniques are possible.

In some embodiments, seal ring structures 210/310 are formed in the interconnect structures 220/320. The seal ring structures 210/310 may be formed, for example, to protect features within the semiconductor structures 200/300 from water, chemicals, residue, and/or other contaminants that may be present during processing. In some cases, the seal ring structures 210/310 may be formed along a periphery or near the edges of the interconnect structures 220/320. The seal ring structures 210/310 may be continuous structures, in some embodiments. For example, the seal ring structure 210 may surround the first HEMT device 112, the conductive lines 222, the conductive vias 223, and/or the conductive pads 224 of the first semiconductor structure 200; and the seal ring structure 310 may surround the second HEMT device 114, the third HEMT device 116, the conductive lines 322, the conductive vias 323, and/or the conductive pads 324 of the second semiconductor structure 300. In some embodiments, the seal ring structures 210/310 are formed using the same process steps that form the contacts 212/314/316, the conductive lines 222/322, the conductive vias 223/323, and/or the conductive pads 224/324. In some embodiments, the seal ring structures 210/310 are electrically isolated from some or all of the other conductive features of the interconnect structures 220/320. The seal ring structures 210/310 shown in FIGS. 6A-6B are examples, and the seal ring structures 210/310 may have other numbers, configurations, or arrangements in other embodiments.

FIGS. 7A-7B, 8A-8B, and 9A-9B illustrate intermediate steps in the formation of seal ring structures 227/327 and contact structures 228/328, in accordance with some embodiments. The seal ring structures 227 and contact structures 228 are formed in the first semiconductor structure 200 (see FIG. 9A), and the seal ring structures 327 and contact structures 328 are formed in the second semiconductor structure 300 (see FIG. 9B), in accordance with some embodiments. The seal ring structures 227/327 may be formed to surround and protect features within the semiconductor structures 200/300, similar to the seal ring structures 210/310 described above. The seal ring structures 227/327 may be formed along a periphery or near the edges of the semiconductor structures 200/300, and may be continuous structures, in some embodiments. The seal ring structures 227/327 may be formed in addition to or instead of the seal ring structures 210/310, and may be formed on the inside or on the outside of the seal ring structures 210/310. The seal ring structures 210 and 227 together or the seal ring structures 310 and 327 together may be referred to as a "seal ring," in some cases. In some embodiments, the contact structures 228/328 may be formed to allow electrical connections to be made through the substrates 202/302 to the HEMT devices 112/114/116. For example, in the embodiment shown in FIG. 9B, the contact structures 328S/328G are formed to provide electrical connections to the contacts 324S/324G from lead connectors 332 (see FIG. 11). In some embodiments, a contact structure may be formed to provide electrical connection to a substrate. For example, in the embodiment shown in FIG. 9A, the contact structure 228S is formed to provide electrical connection between the source contact 212S and the substrate 202. Other dimensions, arrangements, or configurations of seal ring structures 227/327 or contact structures 228/328 are possible in other embodiments.

Figure 7A:
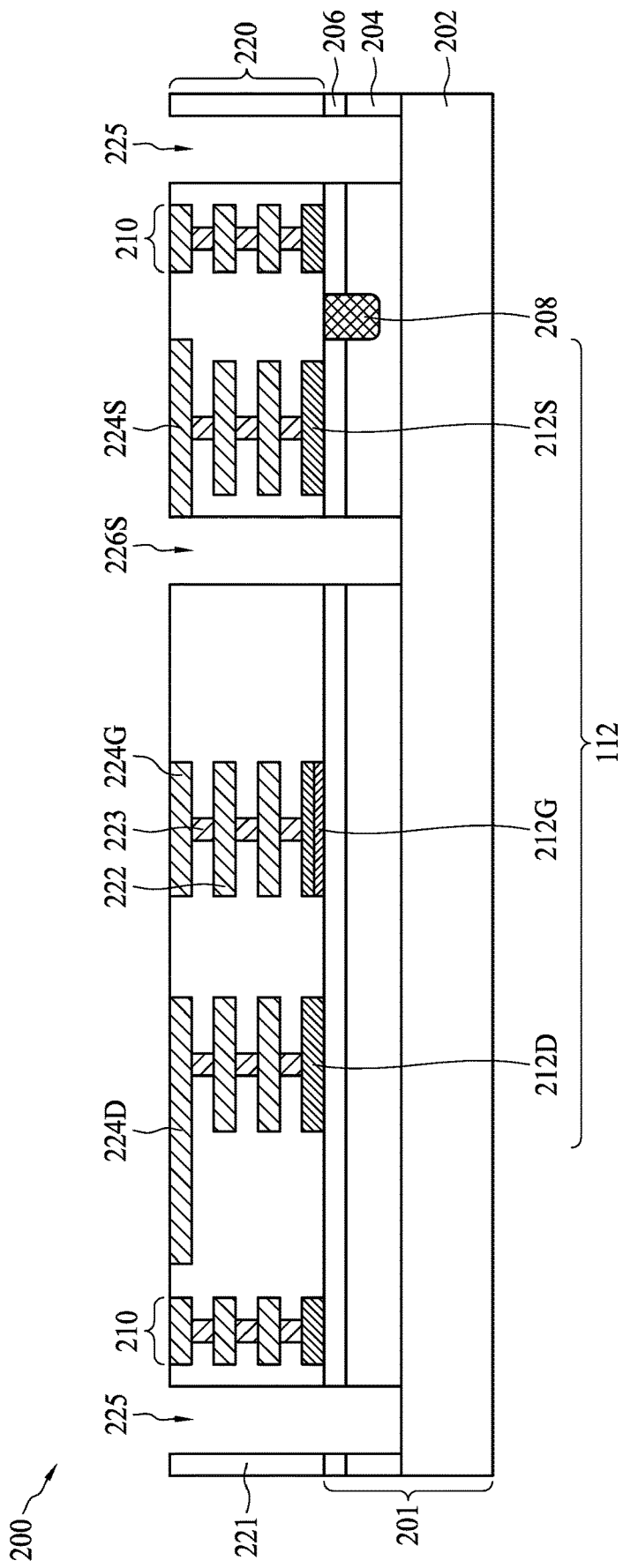
Figure 7B:
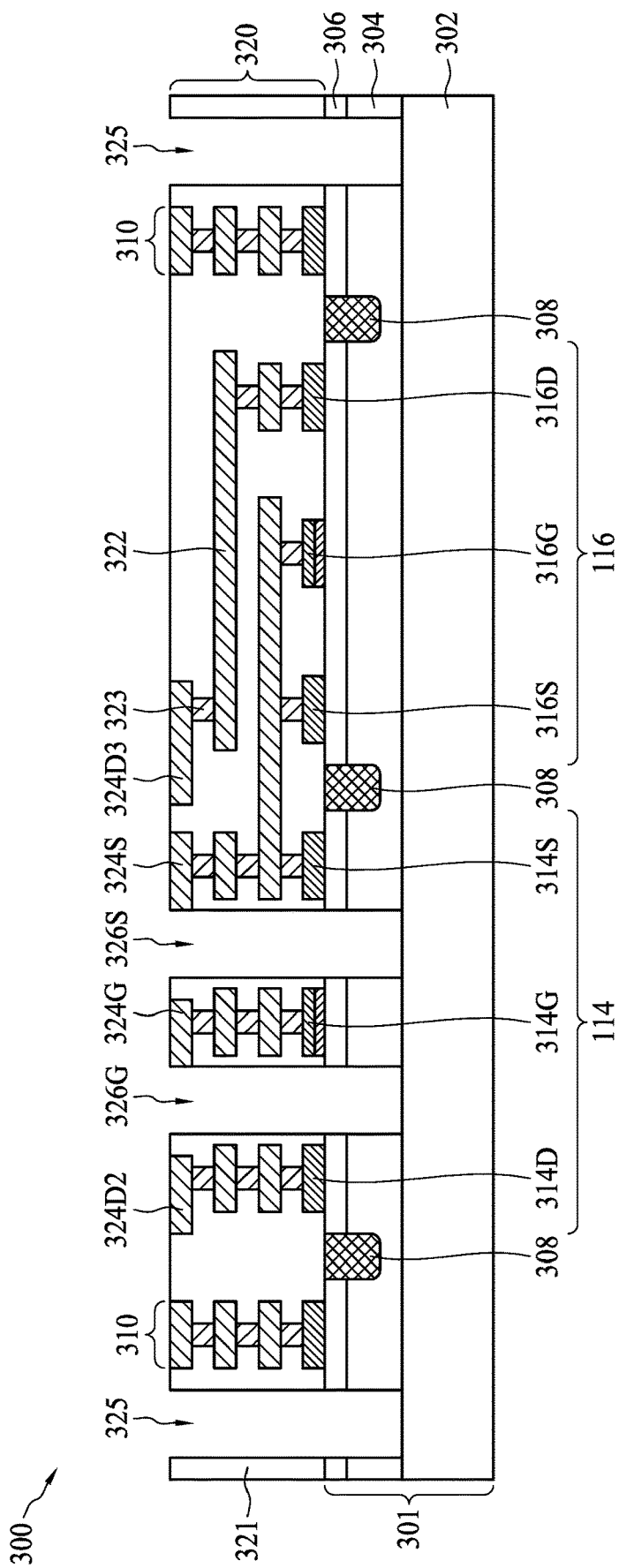

In FIGS. 7A and 7B, openings 225 and 226S are formed in the first semiconductor structure 200, and openings 325, 326S, and 326G are formed in the second semiconductor structure 300, in accordance with some embodiments. The openings 225 and 226S extend through the first interconnect structure 220, the active layer 206, and the channel layer 204 to expose surfaces of the substrate 202. The seal ring structure 227 is subsequently formed in the opening 225. The contact structure 228S is subsequently formed in the opening 226S, and in some embodiments the opening 226S is formed such that a portion of the conductive pad 224S is exposed within the opening 226S. The openings 325, 326S, and 326G extend through the second interconnect structure 320, the active layer 306, and the channel layer 304 to expose surfaces of the substrate 302. The contact structure 328S is subsequently formed in the opening 326S, and in some embodiments the opening 326S is formed such that a portion of the conductive pad 324S is exposed within the opening 326S. The contact structure 328G is subsequently formed in the opening 326G, and in some embodiments the opening 326G is formed such that a portion of the conductive pad 324G is exposed within the opening 326G. The openings 225/226/325/326 may be formed using suitable photolithography and etching techniques.

In FIGS. 8A and 8B, conductive material is deposited in the openings 225/226/325/326 to form seal ring structures 227/327 and contact structures 228/328, in accordance with some embodiments. The conductive material may be deposited on sidewall surfaces and bottom surfaces of the openings 225/226/325/326. The bottom surfaces of the openings 225/226/325/326 may be exposed surfaces of the substrates 202/302, in some embodiments. The sidewall surfaces of the openings 226/326 may include an exposed portion of a conductive pad 224/324, in some embodiments. The conductive material may be similar to the conductive material described previously for forming the conductive features of the interconnect structures 220/320, in some embodiments, for example, the conductive material deposited into the openings 225/226/325/326 may comprise aluminum, tungsten, copper, or the like. The conductive material may be deposited using a suitable technique, such as CVD, PVD, plating, or the like. For example, in some embodiments, a seed layer (not shown) may be blanket deposited on surfaces within the openings 225/226/325/326, and then the conductive material deposited on the seed layer using a plating process. Other materials or techniques are possible.

As shown in FIG. 8A, conductive material in the openings 225 forms the seal ring structures 227, and conductive material in the opening 226S forms the contact structure 228S. The conductive material in the opening 226S physically and electrically contacts an exposed portion of the conductive pad 224S, and thus the contact structure 228S is electrically connected to the conductive pad 224S. The conductive material of the contact structure 228S also physically and electrically contacts an exposed surface of the substrate 202. In this manner, the contact structure 228S may form an electrical connection between the source (e.g. S1) and the "body" of the first HEMT device 112, in some embodiments.

As shown in FIG. 8B, conductive material in the openings 325 forms the seal ring structures 327, conductive material in the opening 326S forms the contact structure 328S, and conductive material in the opening 326G forms the contact structure 328G. The conductive material in the opening 326S physically and electrically contacts an exposed portion of the conductive pad 324S, and thus the contact structure 328S is electrically connected to the conductive pad 324S. The conductive material in the opening 326G physically and electrically contacts an exposed portion of the conductive pad 324G, and thus the contact structure 328G is electrically connected to the conductive pad 324G.

In FIGS. 9A and 9B, dielectric material 229/329 is deposited to fill the openings 225/226/325/326, in accordance with some embodiments. The dielectric material 229 may be deposited over the first semiconductor structure 200 to fill the openings 225 and 226S, and the dielectric material 329 may be deposited over the second semiconductor structure 300 to fill the openings 325, 326S, and 326G. The dielectric material 229/329 may be a material similar to those described previously for the dielectric layers 221/321, in some embodiments. For example, the dielectric material 229/329 may be silicon oxide, silicon nitride, glass, molding compound, a polymer, or the like, and may be deposited using a suitable process such as CVD, Flowable CVD (FCVD), PVD, ALD, or the like. Other materials or deposition techniques are possible. The dielectric material 229/329 may provide electrical isolation, protection during processing, and/or structural support. In some embodiments, a planarization process (e.g., a CMP process, a grinding process, or the like) is performed to remove excess dielectric material 229/329 from top surfaces of the interconnect structures 220/320. In some embodiments, the planarization process may also remove excess conductive material that was deposited to form the seal ring structures 227/327 and the contact structures 228/328.

In FIG. 10, the first semiconductor structure 200 is bonded to the second semiconductor structure 300, in accordance with some embodiments. Bonding the first semiconductor structure 200 to the second semiconductor structure 300 electrically connects the first HEMT device 112, the second HEMT device 114, and the third HEMT device 116. For example, in some embodiments, the conductive pad 224S is bonded to the conductive pad 324D2 by a conductive connector 120A, which electrically connects the source (e.g., the first source S1) of the first HEMT device 112 to the drain (e.g. the second drain D2) of the second HEMT device 114. In some embodiments, the conductive pad 224G is bonded to the conductive pad 324D3 by a conductive connector 120B, which electrically connects the gate (e.g., the first gate G1) of the first HEMT device 112 to the drain (e.g., the third drain D3) of the third HEMT device 116. In this manner, a single structure may be formed that includes the first HEMT device 112, the second HEMT device 114, and the third HEMT device 116 in a cascode configuration.

The conductive connectors 120A-B may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 120A-B may include a conductive material such as solder, copper, aluminum, gold, nickel, silver, palladium, tin, the like, or a combination thereof. In some embodiments, the conductive connectors 120A-B are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 120A-B comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, the conductive connectors 120A-B are formed on the first semiconductor structure 200 (e.g., on the conductive pads 224S and 224G), and then the conductive connectors 120A-B are placed into physical contact with the second semiconductor structure 300 (e.g., on the conductive pads 324D2 and 324D3) using, e.g., a pick-and-place process or the like. Once in physical contact, a reflow process may be utilized to bond the conductive connectors 120A-B to the semiconductor structure 300. In other embodiments, the conductive connectors 120A-B are formed on the second semiconductor structure 300 instead of the first semiconductor structure 200. In other embodiments, conductive connectors or material thereof are formed on both the first semiconductor structure 200 and the second semiconductor structure 300.

In other embodiments, conductive connectors 120 are not formed on the semiconductor structures 200/300, and the semiconductor structures 200/300 are bonded using a direct bonding technique such as fusion bonding, metal-to-metal bonding, dielectric-to-dielectric bonding, hybrid bonding, thermocompression bonding, or the like. For example, the conductive pad 224S may be bonded to the conductive pad 324D2 using metal-to-metal bonding, and the conductive pad 224G may be bonded to the conductive pad 324D3 using metal-to metal bonding.

In some embodiments, an underfill 105 is deposited in the gap between the first semiconductor structure 200 and the second semiconductor structure 300. The underfill 105 may surround the conductive connectors 120A-B. The underfill 105 may be a material such as a molding compound, an encapsulant, an epoxy, an underfill, a molding underfill (MUF), a resin, or the like. The underfill 105 can protect the conductive connectors 120 and may provide structural support for the cascode HEMT device 100 (see FIG. 11). In some embodiments, the underfill 105 may be applied in liquid or semi-liquid form and then subsequently cured. In some embodiments, the underfill 105, the first semiconductor structure 200, and/or the second semiconductor structure 300 have sidewalls that are coplanar or coterminous. In other embodiments, a width of the first semiconductor structure 200 may be different than a width of the second semiconductor structure 300, and thus a sidewall of the first semiconductor structure 200 may be laterally offset from a sidewall of the second semiconductor structure 300. In other embodiments, a sidewall of a semiconductor structure 200/300 is an exposed surface of a contact structure 227/327.

In FIG. 11, through connectors 232D, 332S, and 332G are formed on the first semiconductor structure 200 and the second semiconductor structure 300 to form the cascode HEMT device 100, in accordance with some embodiments. The through connectors 232D/332S/332G allow external electrical connections to be made to the contact structures 228/328. For example, in some embodiments, a through connector 232D is formed through the first semiconductor structure 200 that makes electrical connection to the drain (e.g., the first drain D1) of the first HEMT device 112. In this manner, the through connector 232D may act as the common drain (DC) terminal 110D of the cascode HEMT device 100. In some embodiments, a through connector 332S is formed through the second semiconductor structure 300 that makes electrical connection to the contact structure 328S. In this manner, the through connector 332S may act as the common source (SC) terminal 110S of the cascode HEMT device 100. In some embodiments, a through connector 332G is formed through the second semiconductor structure 300 that makes electrical connection to the contact structure 328G. In this manner, the through connector 332G may act as the common gate (GC) terminal 110G of the cascode HEMT device 100. Forming through connectors 232D/332S/332G as described herein allows for external connections to be made to the cascode HEMT device 100 on both sides of the cascode HEMT device 100 rather than only on a single side of the cascode HEMT device 100. This allows for a more vertically-structured cascode HEMT device 100 that has a reduced area (e.g., "footprint") and shorter internal interconnections.

In some embodiments, prior to forming the through connectors 232D/332S/332G, the substrate 202 and/or the substrate 302 are thinned using a planarization process, such as a CMP process or a grinding process. In some embodiments, the through connector 232D is formed by forming an opening (not shown) in the first semiconductor structure 200 that extends through the first wafer 201 and the dielectric layers 221 of the first interconnect structure 220 to expose a portion of the conductive pad 224D. The opening may be formed using a suitable photolithography and etching process. In some embodiments, an insulating layer 230 is then deposited on top surfaces of the substrate 202 and on sidewalls of the opening. The insulating layer 230 may comprise one or more layers of dielectric material, such as an oxide material, a nitride material, a polymer material, a glass material, or the like, which may be formed using any suitable techniques. A conductive material may then be deposited in the opening (e.g., on the exposed portion of the conductive pad 224D) and on upper surfaces of the insulating layer 230 to form the through connector 232D. The conductive material may comprise, for example, aluminum, tungsten, copper, or the like. The conductive material may be deposited using a suitable technique, such as CVD, PVD, plating, or the like. For example, in some embodiments, a seed layer (not shown) may be blanket deposited and then the conductive material deposited on the seed layer using a plating process. In some embodiments, regions of the seed layer may be covered (e.g., with a patterned photoresist) to block deposition of the conductive material in those regions. Other materials or techniques are possible. In some embodiments, the portion of the through connector 232D extending on a top surface of the insulating layer 230 may have an area that is in the range of about 10000 $\mu m^2$ to about 100 $mm^2$, though other areas are possible. In some cases, the formation of a through connector 232D as described herein allows for a large contact area (e.g., to the die pad 155 shown in FIGS. 12A-12B), which can reduce resistance and improve heat dissipation.

In some embodiments, the through connectors 332S and 332G are formed by forming openings (not shown) in the second semiconductor structure 300 that extend through the substrate 302 to expose portions of contact structures 328S and 328G, respectively. The openings may be formed using a suitable photolithography and etching process. In some embodiments, an insulating layer 330 is then deposited on top surfaces of the substrate 302 and on sidewalls of the openings. A conductive material may then be deposited in the openings (e.g., on the exposed portions of the contact structures 328S and 328G) and on upper surfaces of the insulating layer 330 to form the through connectors 332S and 332G. The conductive material may comprise, for example, aluminum, tungsten, copper, or the like. The conductive material may be deposited using a suitable technique, such as CVD, PVD, plating, or the like. For example, in some embodiments, a seed layer (not shown) may be blanket deposited and then the conductive material deposited on the seed layer using a plating process. In some embodiments, regions of the seed layer may be covered (e.g., with a patterned photoresist) to block deposition of the conductive material in those regions. Other materials or techniques are possible. In some embodiments, the portion of the through connector 332S extending on a top surface of the insulating layer 230 may have an area that is in the range of about 10000 $\mu m^2$ to about 100 $mm^2$, and the portion of the through connector 332G extending on a top surface of the insulating layer 230 may have an area that is in the range of about 10000 $\mu m^2$ to about 100 $mm^2$. Other areas are possible.

Figure 12A:
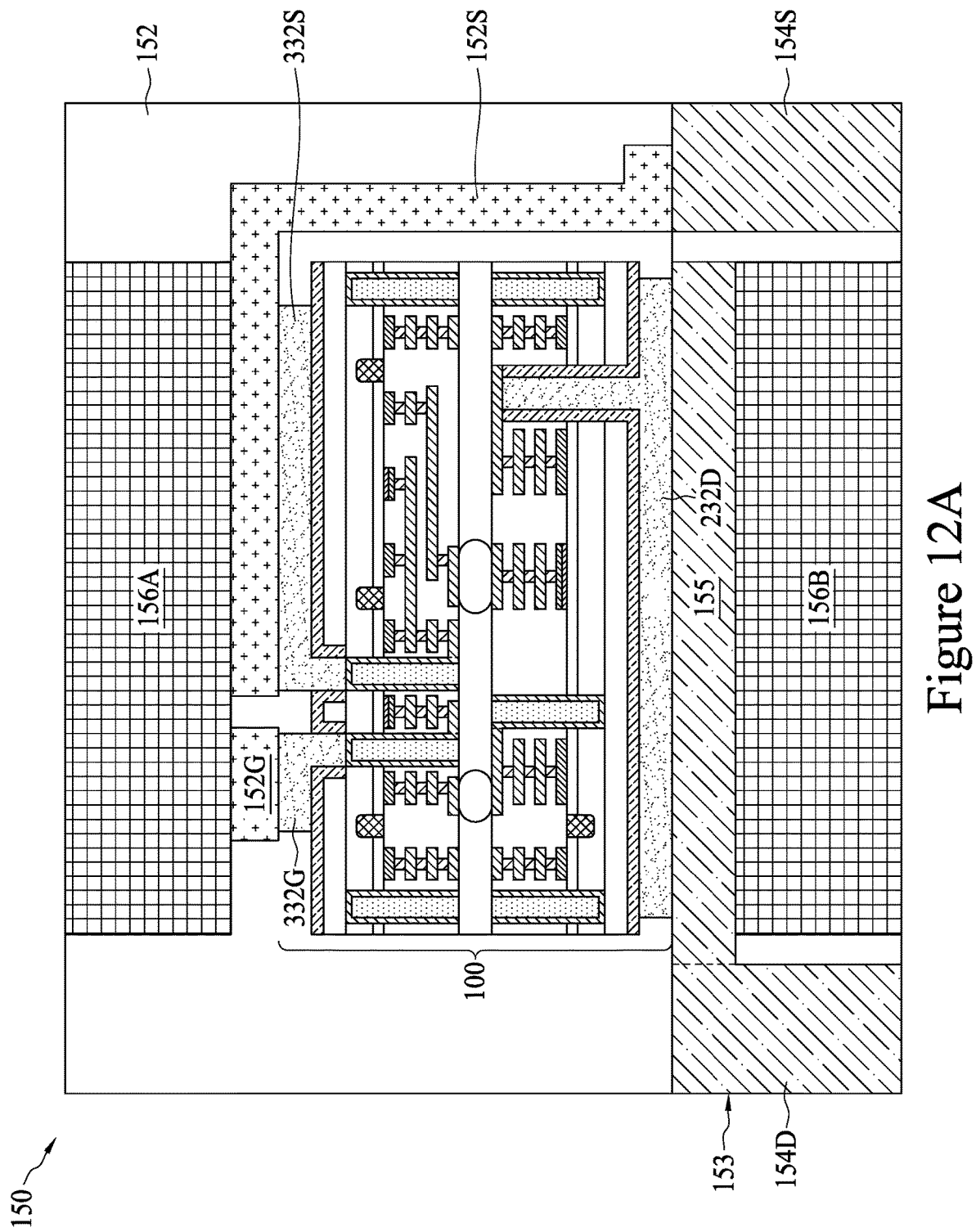
FIGS. 12A and 12B illustrate a cross-sectional view and a plan view of a packaged cascode HEMT device, in accordance with some embodiments.
Figure 12B:
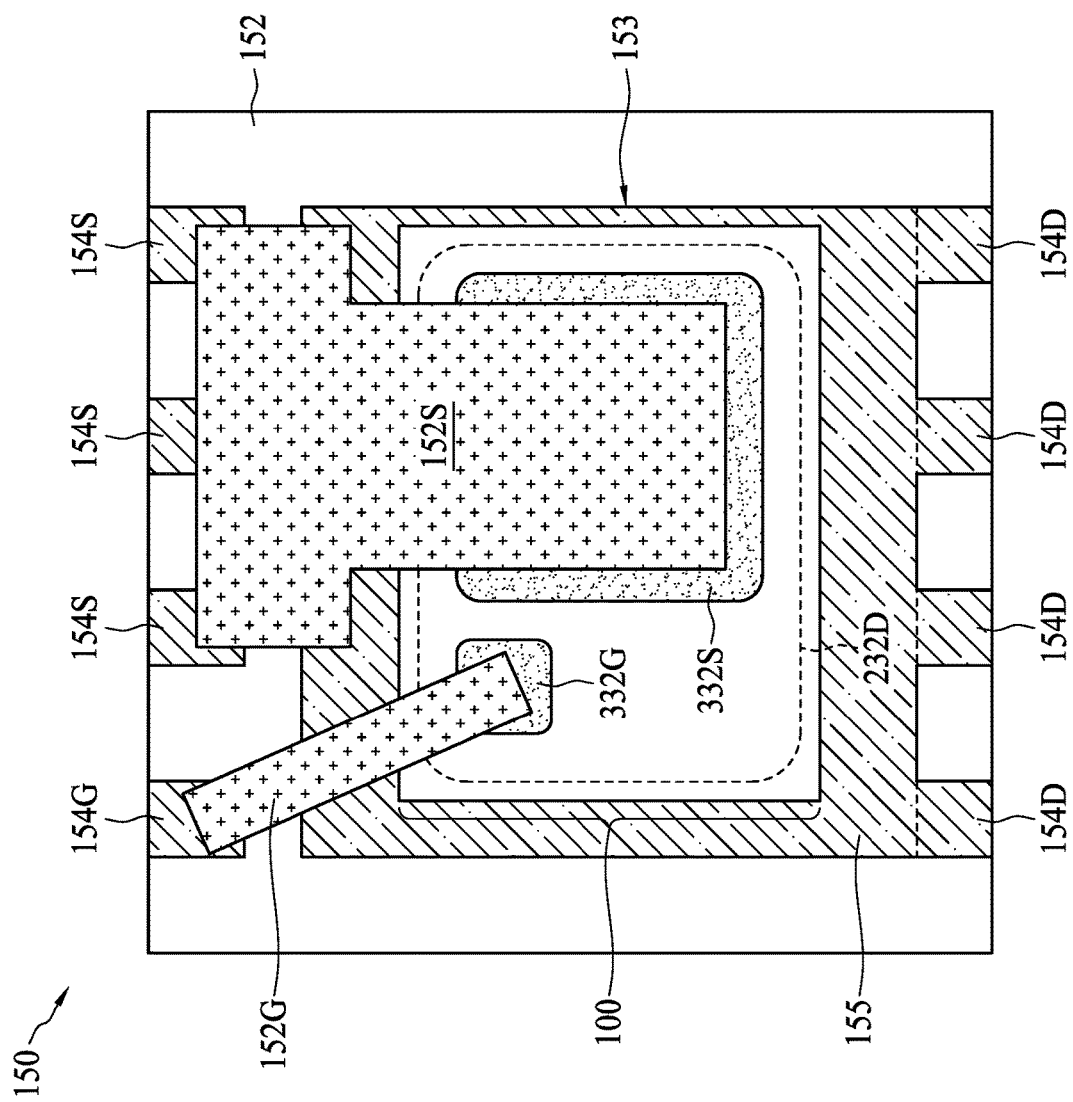

In some embodiments, a cascode HEMT device as described herein may be incorporated into a package. For example, FIGS. 12A and 12B illustrate a cross-sectional view and a plan view of a package 150 that includes a cascode HEMT device 100, in accordance with some embodiments. The plan view illustrated in FIG. 12B is for illustrative purposes, and some features are not shown for clarity. Additionally, the embodiments shown in FIGS. 12A-12B are illustrative examples, and the dimensions, arrangement, or configuration of the various features may be different in other embodiments. The cascode HEMT device 100 may be similar to the cascode HEMT device 100 described in FIG. 11, or may be similar to some other embodiments of cascode HEMT devices described elsewhere herein. The features within the package 150 may be surrounded or encapsulated by a molding material 152, which may comprise a molding compound, an encapsulant, an epoxy, a composite material, or the like.

In some embodiments, the package 150 includes a lead frame 153 comprising a die pad 155 and a plurality of leads 154. The leads 154 are conductive features that allow external connections to the package 150. For example, the package 150 includes one or more leads 154D that are electrically connected to the through connector 232D of the cascode HEMT device 100, one or more leads 154S that are electrically connected to the through connector 332S of the cascode HEMT device 100, and one or more leads 154G that are electrically connected to the through connector 332G of the cascode HEMT device 100. The lead frame 153 also includes a die pad 155, which is a conductive plate to which the cascode HEMT device 100 is attached. In some embodiments, the lead frame 153 and the leads 154D are part of a continuous conductive structure.

As shown in FIGS. 12A-12B, the through connector 232D of the cascode HEMT device 100 is attached to the die pad 155, which electrically connects the leads 154D to the common drain (DC) terminal 110D of the cascode HEMT device 110. In some embodiments, the through connector 232D is attached to the die pad 155 by a conductive adhesive, solder, or the like. In some embodiments, the area of the through connector 232D may be almost as large as the area of the cascode HEMT device 100. For example, in some embodiments, the area of the through connector 232D may be between about 30% and about 100% of the area of the cascode HEMT device 100. Accordingly, the interconnection area between the die pad 155 and the through connector 232D may be about as large as the area of the through connector 232D, which may be about as large as the area of the entire cascode HEMT device 100 in some cases. In some cases, larger conductive features and/or a larger interconnection area may allow for a larger current path, reduced resistance, improved interconnection, greater current capacity, and/or reduced heating. For example, in some cases, a conductive feature having a large area such as the through connector 232D or the die pad 155 may have less resistance than smaller conductive features such as wire bonds. In this manner, connecting the leads 154 to the cascode HEMT device 100 using the through connector 232 and the die pad 155 as described herein can result in improved efficiency, reduced heating, reduced power consumption, and/or improved performance of a package such as the package 150.

As shown in FIGS. 12A-12B, the through connector 332G of the cascode HEMT device 100 may be electrically connected to the lead 154G by a lead connector 152G, which electrically connects the lead 154G to the common gate (GC) terminal 110G of the cascode HEMT device 110, in some embodiments. The lead connector 152G may be, for example, a metal plate, a metal pad, a metal lead, a metal film or foil, or the like of appropriate shape that is attached to both the through connector 332G and to the lead 154G. In some embodiments, the lead connector 152G is attached by a conductive adhesive, solder, or the like. In other embodiments, the lead connector 152G may be formed of a layer of deposited metal. The lead connector 152G may partially or fully cover the through connector 332G, and thus the interconnection area between the lead connector 152G and the through connector 332G may be about as large as the area of the through connector 332G, in some cases. Forming a larger interconnection area in this manner can reduce resistance and improve device performance, as described previously. Additionally, connecting the lead 154G using a lead connector 152G as described herein rather than a wire bond can allow for reduced resistance and improved device performance.

As shown in FIGS. 12A-12B, the through connector 332S of the cascode HEMT device 100 may be electrically connected to the leads 154S by a lead connector 152S, in some embodiments. The lead connector 152S may be similar to the lead connector 152G, though the lead connector 152S may have a different shape or different dimensions than the lead connector 152G. In some embodiments, all of the leads 154S are connected to the through connector 332S by a single lead connector 152S. The lead connector 152S may partially or fully cover the through connector 332S, and thus the interconnection area between the lead connector 152S and the through connector 332S may be about as large as the area of the through connector 332S, in some cases. Forming a larger interconnection area in this manner can reduce resistance and improve device performance, as described previously. Additionally, connecting the leads 154G using a single lead connector 152S as described herein rather than wire bonds can allow for reduced resistance and improved device performance.

In some embodiments, the package 150 may include one or more heatsinks 156 to improve heat dissipation and thermal performance of the cascode HEMT device 100. For example, one heatsink 156A may be disposed over one side of the cascode HEMT device 100, and one heatsink 156B may be disposed over the opposite side of the cascode HEMT device 100. In this manner, the cascode HEMT device 100 may be "sandwiched between" two heatsinks 156A-B. As shown in FIG. 12A, one heatsink 156A may be positioned relatively close to the second HEMT device 114 and the third HEMT device 116, and one heatsink 156B may be positioned relatively close to the first HEMT device 112. Positioning the heatsinks 156A-B near the HEMT devices 112/114/116 on opposite sides of the cascode HEMT device 100 in this manner can allow for improved heat dissipation and improved thermal performance. In some embodiments, one heatsink 156A may be attached to or positioned near the lead connectors 152S and/or 152G, and one heatsink 156B may be attached to or positioned near the die pad 155. In some cases, attaching the heatsinks 156A-B to the conductive features 152S/152G/155 can improve heat dissipation. In some cases, the large areas of the lead connectors 152S/152G and the die pad 155 allow for the attachment of heatsinks 156A-B having correspondingly large areas, which can improve heat dissipation and thermal performance.

Figure 13:
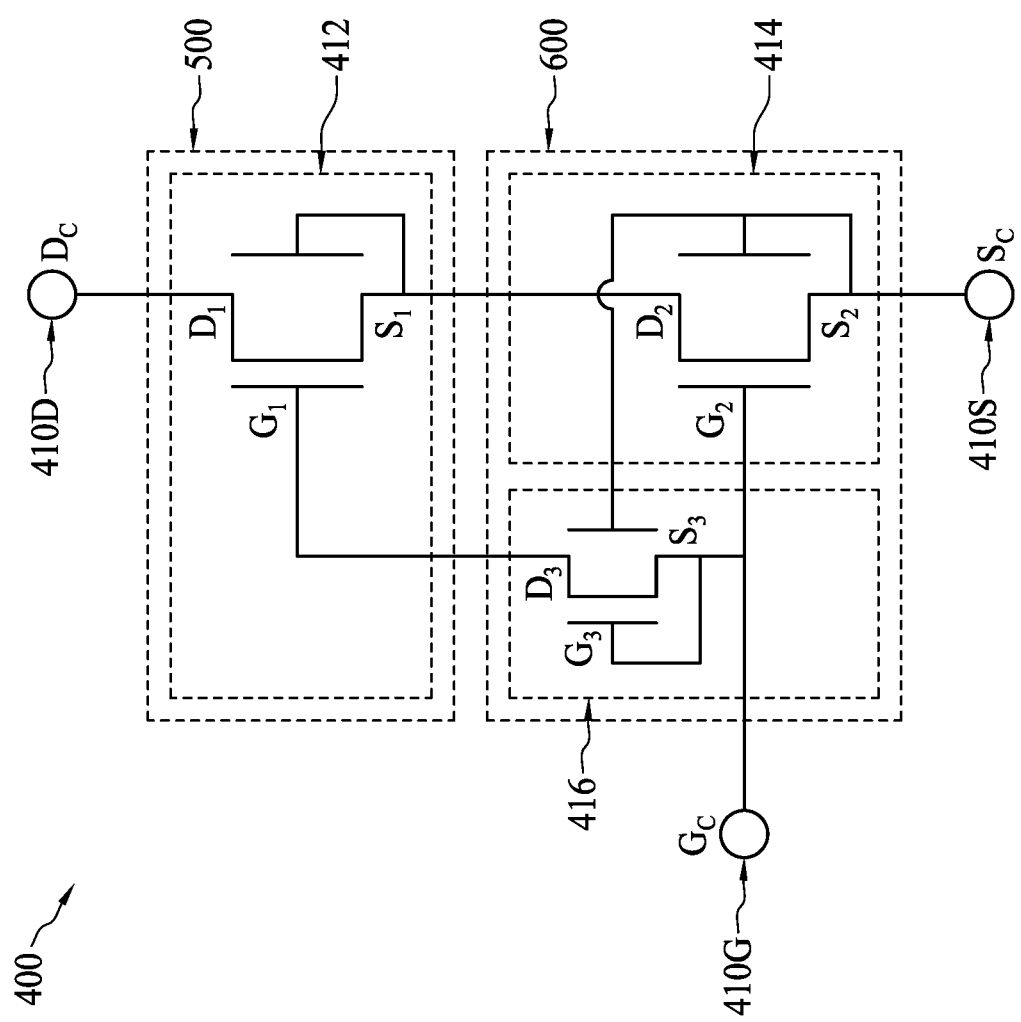
FIG. 13 illustrates a schematic diagram of a cascode high electron mobility transistor (HEMT) device, in accordance with some embodiments.

FIG. 13 illustrates a schematic diagram of a cascode high electron mobility transistor (HEMT) device 400, in accordance with some embodiments. The cascode HEMT device 400 comprises a first HEMT device 412, a second HEMT device 414, and a third HEMT device 416. The cascode HEMT device 400 is similar to the cascode HEMT device 100 described previously for FIG. 1, except that all three of the HEMT devices 412/414/416 of the cascode HEMT device 400 are enhancement mode devices. (In the cascode HEMT device 100, the first HEMT device 112 is a depletion mode device, and the second HEMT device 114 and the third HEMT device 116 are enhancement mode devices.) The cascode HEMT device 400 may be formed using similar materials and/or techniques as described previously for the cascode HEMT device 100. For example, the first HEMT device 412 may be formed in a first semiconductor structure 500, and the second HEMT device 414 and the third HEMT device 416 may both formed in a separate second semiconductor structure 600. Accordingly, some details, features, materials, or techniques of the cascode HEMT device 400 that are similar to those described previously for the cascode HEMT device 100 may not be repeated in the discussions below.

Still referring to FIG. 13, the cascode HEMT device 400 comprises a first HEMT device 412 having a first source S1, a first drain D1, and a first gate G1; a second HEMT device 414 having a second source S2, a second drain D2, and a second gate G2; and a third HEMT device 416 having a third source S3, a third drain D3, and a third gate G3. The first HEMT device 412 and the second HEMT device 414 are connected in a cascode configuration. For example, the first HEMT device 412 may be considered a common gate stage and the second HEMT device 414 may be considered a common source stage, with the first source S1 coupled to the second drain D2. The third HEMT device 416 is in a diode-connected configuration and is coupled to the first HEMT device 412 and the second HEMT device 414. For example, the third gate G3 is coupled to the third source S3, the third drain D3 is coupled to the first gate G1, and the third source S3 is coupled to the second source S2. The third HEMT device 416 may be configured, for example, to protect the second HEMT device 414 from high voltages (e.g., high voltages between the first drain D1 and the first gate G1) that may cause damage.

As described previously, the first HEMT device 412, the second HEMT device 414, and the third HEMT device 416 are enhancement mode devices (i.e., normally-off devices). The HEMT devices 412, 414, or 416 may have similar respective breakdown voltages or different respective breakdown voltages. For example, in some embodiments, the first HEMT device 412 may have a greater breakdown voltage than the second HEMT device 414. Other configurations are possible. Coupling the first HEMT device 412 and the second HEMT device 414 in a cascode configuration allows the cascode HEMT device 400 to operate in a manner that is similar to a single high-voltage transistor device. For example, the first HEMT device 412 and the second HEMT device 414 are configured to collectively form a common source (SC) terminal 410S of the cascode HEMT device 400, a common drain (DC) terminal 410D of the cascode HEMT device 400, and a common gate (GC) terminal 410G of the cascode HEMT device 400. The cascode HEMT device 400 has a breakdown voltage that is greater than the respective breakdown voltages of either the first HEMT device 412 or the second HEMT device 414. For example, in some embodiments, the first HEMT device 412 and the second HEMT device 414 may have respective breakdown voltages of approximately 650 V, while the cascode HEMT device 400 may have a breakdown voltage of approximately 1200 V. Other breakdown voltages are possible. By using the first HEMT device 412 and the second HEMT device 414 to operate as a single high voltage device as described herein, a cascode HEMT device 400 is able to achieve a high breakdown voltage without using HEMT devices having individually high breakdown voltages, which can reduce the size or the cost of a high voltage device.

Figure 14:
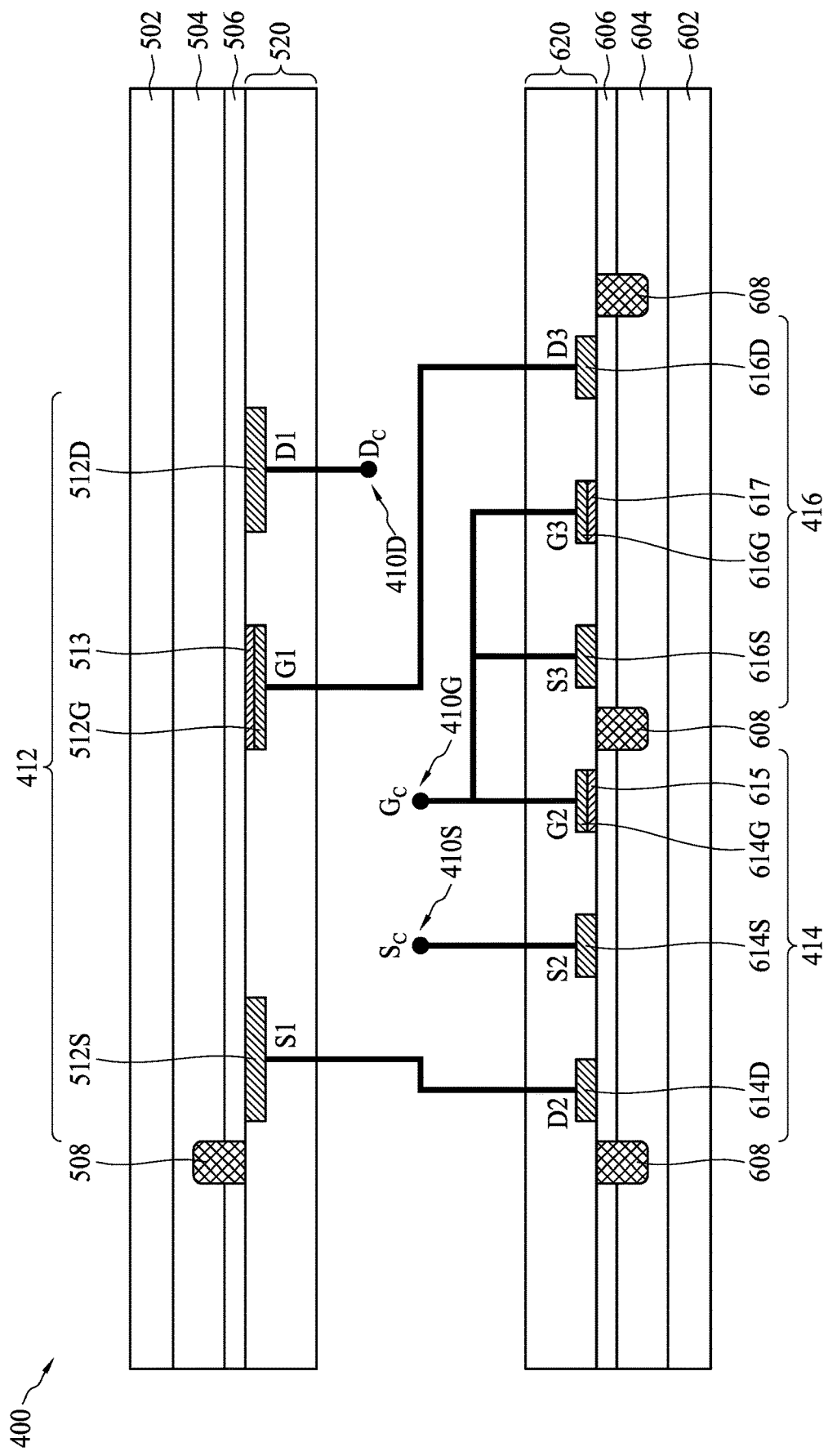
FIG. 14 illustrates a schematic cross-sectional view of a cascode HEMT device, in accordance with some embodiments.

FIG. 14 illustrates a schematic cross-sectional view of a cascode HEMT device 400, in accordance with some embodiments. The cascode HEMT device 400 shown in FIG. 14 may be similar to the cascode HEMT device 400 shown in FIG. 13. It will be appreciated that the cross-sectional view of FIG. 14 is a schematic view shown for explanatory purposes and may not be representative of sizes and/or shapes of some components within the device. Additionally, some features may only be shown schematically or may not be shown.

As shown in FIG. 14, the first HEMT device 412 has a source contact 512S which corresponds to the first source S1, a drain contact 512D which corresponds to the first drain D1, and a gate contact 512G over a gate structure 513 which collectively correspond to the first gate G1; the second HEMT device 414 has a source contact 614S which corresponds to the second source S2, a drain contact 614D which corresponds to the second drain D2, and a gate contact 614G over a gate structure 615 which collectively correspond to the second gate G2; and the third HEMT device 416 has a source contact 616S which corresponds to the third source S3, a drain contact 616D which corresponds to the third drain D3, and a gate contact 616G over a gate structure 617 which collectively correspond to the third gate G3. The gate structures 513/615/617 each comprise one or more layers of semiconductor materials with an overlying gate electrode. The semiconductor materials may comprise, for example, p-doped gallium nitride or the like. In some embodiments, the gate contact (e.g., 512G, 614G, or 616G) may function as the gate electrode.

In some embodiments, the first semiconductor structure 500 comprises a first interconnect structure 520 over a first wafer 501, and the second semiconductor structure 600 comprises a second interconnect structure 620 over the second wafer 601. The wafers 501/601 may be similar to the wafers 201/301 described previously. For example, the wafers 501/601 may comprise a substrate 502/602, a channel layer 504/604, and an active layer 506/606. The interconnect structures 520/620 may each comprise multiple layers of dielectric material and multiple layers of conductive features, similar to the interconnect structure 220/320 described previously.

Figure 15A:
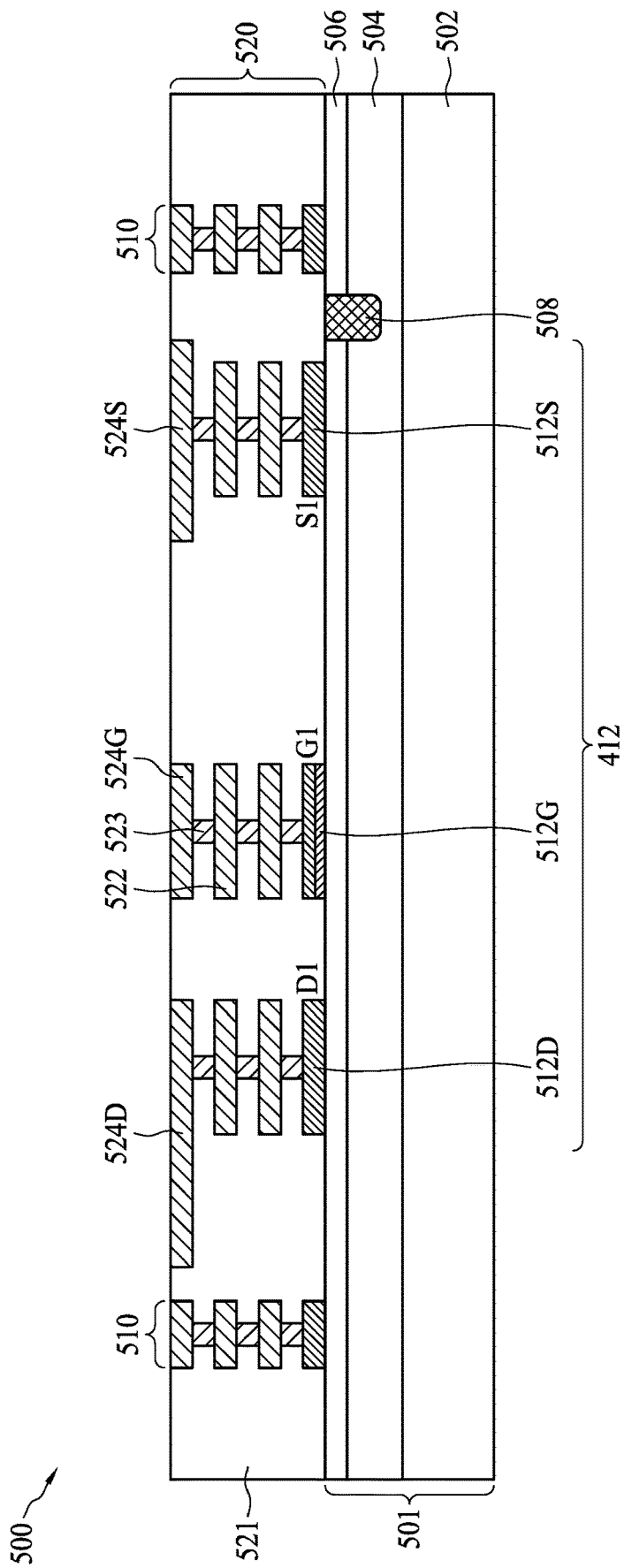
FIGS. 15A, 15B, 16A, and 16B illustrate cross-sectional views of intermediate steps in the formation of a first semiconductor structure and a second semiconductor structure of a cascode HEMT device, in accordance with some embodiments.
Figure 15B:
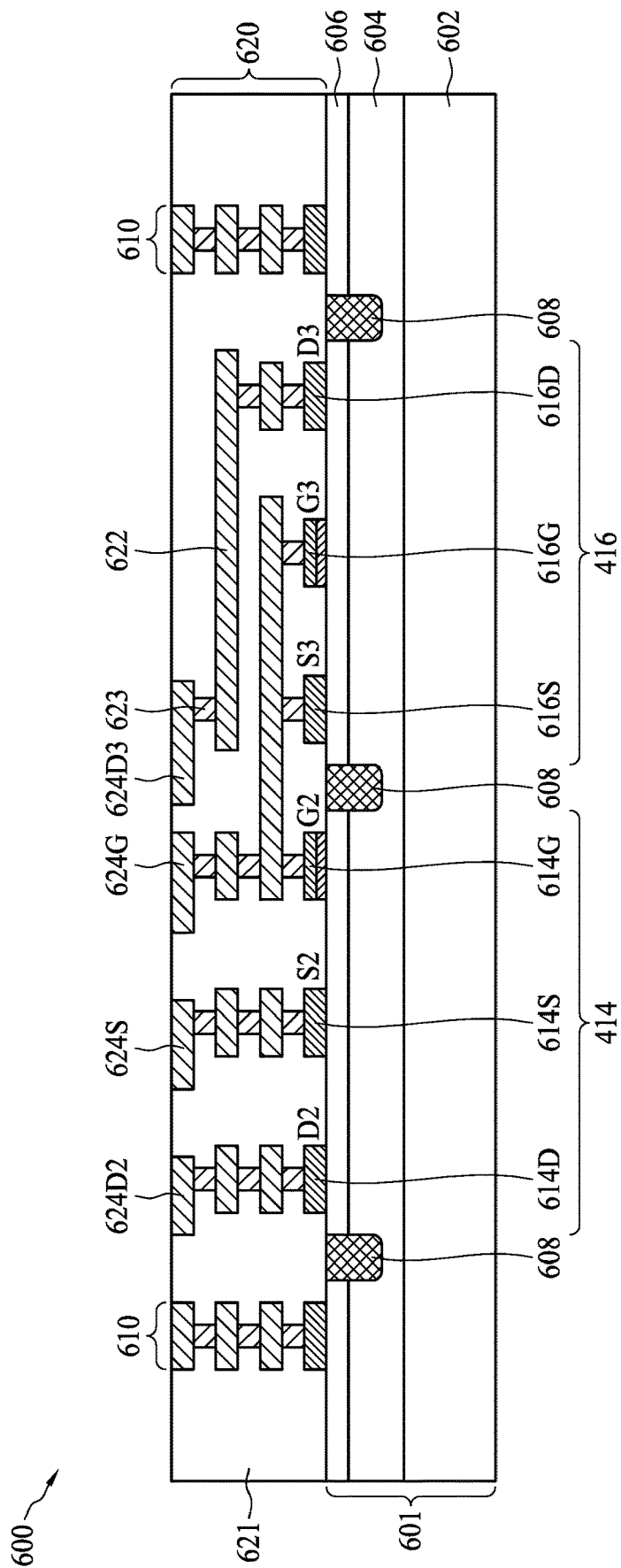
Figure 16A:
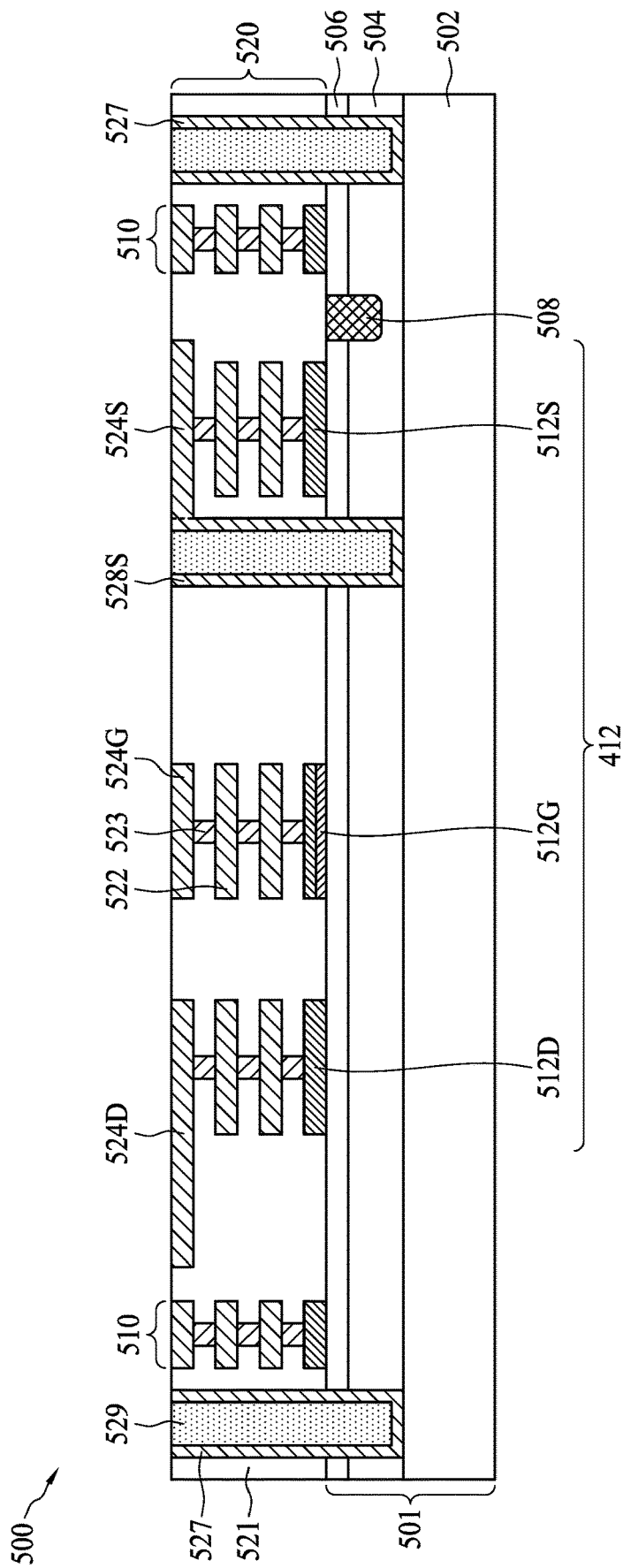
Figure 16B:
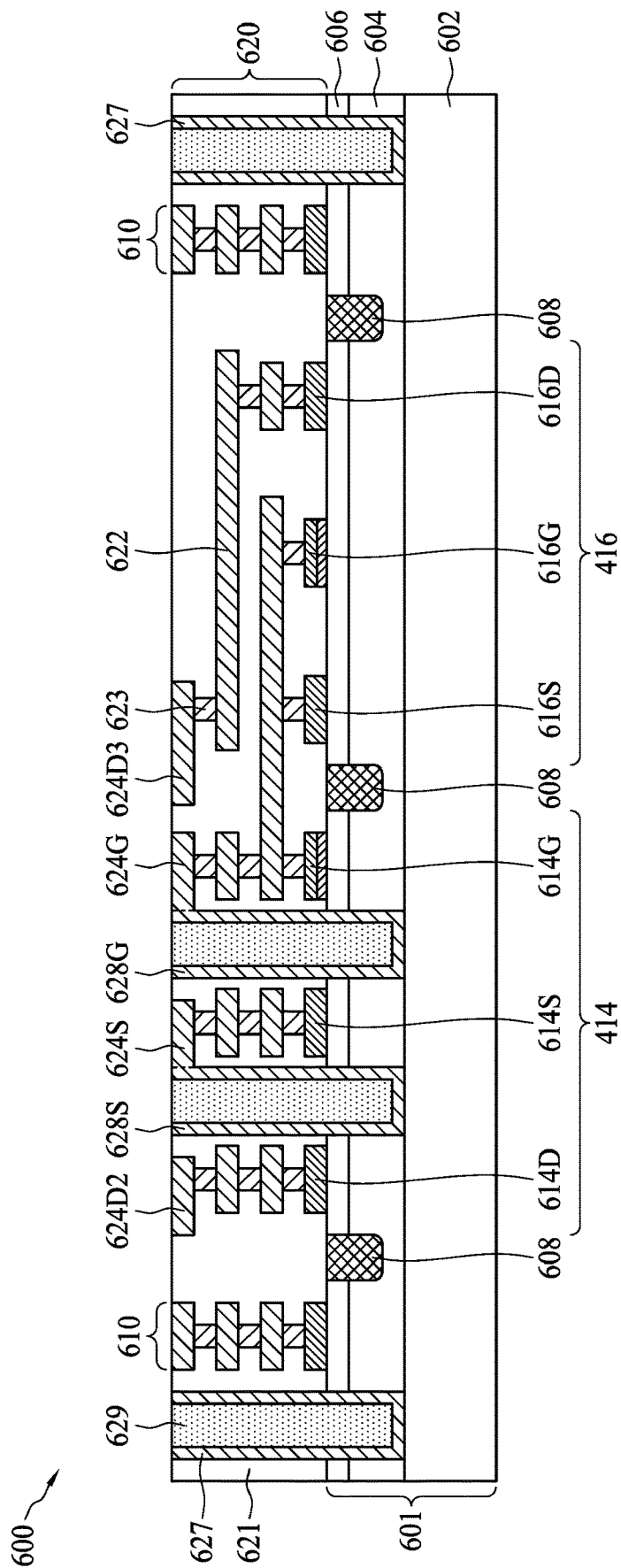
Figure 17:
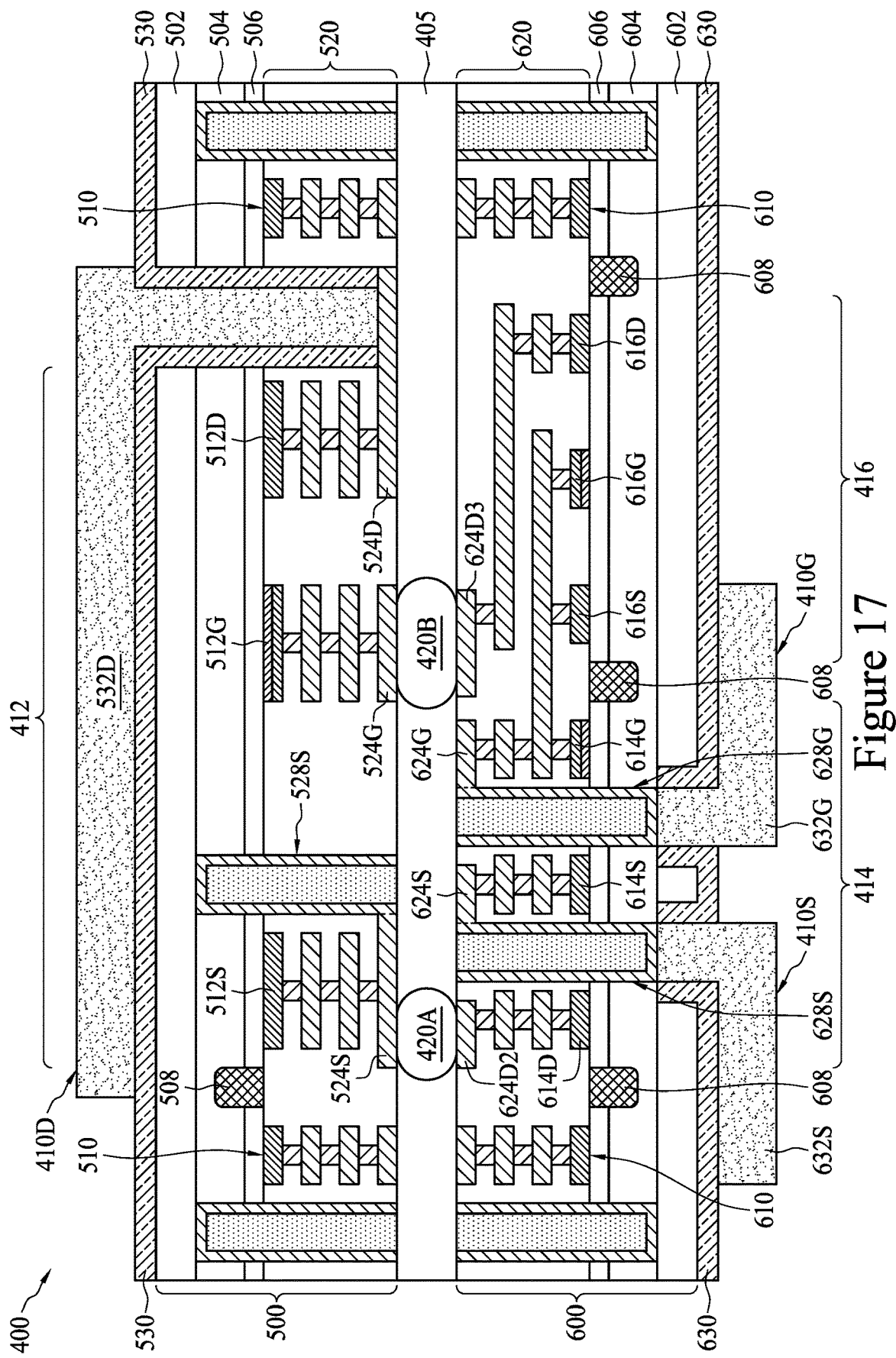
FIG. 17 illustrates an intermediate step in the formation of a cascode HEMT device, in accordance with some embodiments.

FIGS. 15A through 17 illustrate cross-sectional views of intermediate steps in the formation of a cascode HEMT device 400 (see FIG. 17), in accordance with some embodiments. The cascode HEMT device 400 may be similar to the cascode HEMT device 400 shown in FIG. 13 or the cascode HEMT device 400 shown in FIG. 14. FIGS. 15A and 16A illustrate cross-sectional views of intermediate steps in the formation of the first semiconductor structure 500, and FIGS. 15B and 16B illustrate cross-sectional views of intermediate steps in the formation of the second semiconductor structure 600, in accordance with some embodiments. FIG. 17 illustrates a cross-sectional view of a cascode HEMT device 400, in accordance with some embodiments.

FIGS. 15A and 15B illustrate cross-sectional views of a first semiconductor structure 500 and a second semiconductor structure 600, respectively, in accordance with some embodiments. The first semiconductor structure 500 and the second semiconductor structure 600 may be formed using materials and techniques similar to those described previously for the first semiconductor structure 200 and the second semiconductor structure 300. The first HEMT device 412 is formed in the first semiconductor structure 500, and the second HEMT device 414 and the third HEMT device 416 are formed in the second semiconductor structure 600, in some embodiments. Isolation regions 508 may be formed in the first wafer 501, and isolation regions 608 may be formed in the second wafer 601.

The first interconnect structure 520 is formed over the first wafer 501, and may comprise dielectric layers 521 and conductive features such as conductive lines 522, conductive vias 523, conductive pads 524, and seal ring structures 510. For example, a conductive pad 524S may be electrically connected to the source contact 512S, a conductive pad 524D may be electrically connected to the drain contact 512D, and a conductive pad 524G may be electrically connected to the gate contact 512G. The second interconnect structure 620 is formed over the second wafer 601, and may comprise dielectric layers 621 and conductive features such as conductive lines 622, conductive vias 623, conductive pads 624, and seal ring structures 610. For example, a conductive pad 624S may be electrically connected to the source contact 614S, a conductive pad 624D2 may be electrically connected to the drain contact 614D, a conductive pad 624D3 may be electrically connected to the drain contact 616D, and a conductive pad 624G may be electrically connected to the gate contact 614G, the source contact 616S, and the gate contact 616G.

FIGS. 16A and 16B illustrate the first semiconductor structure 500 and the second semiconductor structure 600 after formation of seal ring structures 527/627 and contact structures 528/628, in accordance with some embodiments. The seal ring structures 527/627 and contact structures 528/628 may be similar to the seal ring structures 227/327 or contact structures 228/328 described previously, and may be formed using similar materials or techniques. For example, in some embodiments, openings may be etched in the semiconductor structures 500/600 that expose the substrates 502/602. A conductive material may be deposited in the openings, and then a dielectric material may be deposited over the conductive material. This is an example, and other techniques are possible.

Referring to FIG. 16A, the conductive material of the contact structure 528S physically and electrically contacts an exposed portion of the conductive pad 524S, and thus the contact structure 528S is electrically connected to the conductive pad 524S. The conductive material of the contact structure 528S also physically and electrically contacts an exposed surface of the substrate 502. In this manner, the contact structure 528S may form an electrical connection between the source (e.g. S1) and the "body" of the first HEMT device 412, in some embodiments. Referring to FIG. 16B, the conductive material of the contact structure 628S physically and electrically contacts an exposed portion of the conductive pad 624S, and thus the contact structure 628S is electrically connected to the conductive pad 624S. The conductive material of the contact structure 628G physically and electrically contacts an exposed portion of the conductive pad 624G, and thus the contact structure 628G is electrically connected to the conductive pad 624G.

In FIG. 17, the first semiconductor structure 500 is bonded to the second semiconductor structure 600, and through connectors 532D, 632S, and 632G are formed to form the cascode HEMT device 400, in accordance with some embodiments. Bonding the first semiconductor structure 500 to the second semiconductor structure 600 electrically connects the first HEMT device 412, the second HEMT device 414, and the third HEMT device 416. For example, in some embodiments, the conductive pad 524S is bonded to the conductive pad 624D2 by a conductive connector 420A, which electrically connects the source (e.g., the first source S1) of the first HEMT device 412 to the drain (e.g. the second drain D2) of the second HEMT device 414. In some embodiments, the conductive pad 524G is bonded to the conductive pad 624D3 by a conductive connector 420B, which electrically connects the gate (e.g., the first gate G1) of the first HEMT device 412 to the drain (e.g., the third drain D3) of the third HEMT device 416. In this manner, a single structure may be formed that includes the first HEMT device 412, the second HEMT device 414, and the third HEMT device 416 in a cascode configuration. The conductive connectors 420A-B may be similar to the conductive connectors 120A-B described previously, and may be formed or bonded using similar techniques. In some embodiments, an underfill 405 is deposited in the gap between the first semiconductor structure 500 and the second semiconductor structure 600. The underfill 405 may surround the conductive connectors 420A-B, and may be similar to the underfill 105 described previously.

Still referring to FIG. 17, through connectors 532D, 632S, and 632G are formed on the first semiconductor structure 500 and the second semiconductor structure 600, in accordance with some embodiments. The through connectors 532D/632S/632G allow external electrical connections to be made to conductive pad(s) 524 and contact structures 528/628. For example, in some embodiments, a through connector 532D is formed through the first semiconductor structure 500 that makes electrical connection to the drain (e.g., the first drain D1) of the first HEMT device 412. In this manner, the through connector 532D may act as the common drain (DC) terminal 410D of the cascode HEMT device 400. In some embodiments, a through connector 632S is formed through the second semiconductor structure 600 that makes electrical connection to the contact structure 628S. In this manner, the through connector 632S may act as the common source (SC) terminal 410S of the cascode HEMT device 400. In some embodiments, a through connector 632G is formed through the second semiconductor structure 600 that makes electrical connection to the contact structure 628G. In this manner, the through connector 632G may act as the common gate (GC) terminal 410G of the cascode HEMT device 400.

The through connectors 532D/632S/632G may be similar to the through connectors 232D/332S/332G described previously, and may be formed using similar materials or techniques. For example, an opening may be formed in the first semiconductor structure 500 that extends through the substrate 502 and the first interconnect structure 520 to expose a portion of the conductive pad 524D. An insulating layer 530 may be deposited, and then a conductive material may be deposited in the opening to form the through connector 532D. Openings may be formed in the substrate 602 to expose the contact structure 628S and the contact structure 628G. An insulating layer 630 may be deposited, and then a conductive material may be deposited in the openings to form the through connectors 632S and 632G. Other techniques are possible. The substrate 502 and/or the substrate 602 may be thinned prior to forming the through connectors 532D/632S/632G, in some embodiments. In some embodiments, the cascode HEMT device 400 as described herein may be incorporated into a package, which may be similar to the package 150 described for FIGS. 12A-12B.

Embodiments described herein may have some advantages. For example, a single device comprising three high electron mobility transistors (HEMT) in a cascode configuration may allow for increased breakdown voltages, such as greater than about 1200 V. In some embodiments, the HEMTs are formed in two substrates that are bonded together into a single HEMT structure (e.g., a die, package component, or the like). By forming the HEMTs on two substrates, the electrical interconnections between the HEMTs may be made shorter, which can reduce parasitic resistance, parasitic inductance, and reduce electrical mismatch. Improving the electrical interconnections in this manner can improve device efficiency and performance. Additionally, forming a HEMT structure by bonding two substrates can result in a HEMT structure having a smaller area. Additionally, bonding two substrates to form a single HEMT structure can allow for improved heat dissipation, such as by sandwiching the HEMT structure between two heatsinks.

In accordance with some embodiments of the present disclosure, a semiconductor device includes a first semiconductor structure including a first high electron mobility transistor (HEMT) device, wherein the first HEMT device includes a first gate, a first source, and a first drain; and a second semiconductor structure stacked above and bonded to the first semiconductor structure, wherein the second semiconductor structure includes a second HEMT device and a third HEMT device, wherein the second HEMT device includes a second gate, a second source, and a second drain that is electrically connected to the first source, wherein the third HEMT device includes a third gate, a third source, and a third drain that is electrically connected to the first gate. In an embodiment, the second semiconductor structure is bonded to the first semiconductor structure by solder bumps.

In an embodiment, the first HEMT device is a depletion mode transistor, the second HEMT device is an enhancement mode transistor, and the third HEMT device is an enhancement mode transistor. In an embodiment, the semiconductor device includes a first contact structure electrically connected to the first source, a second contact structure electrically connected to the second gate, and a third contact structure electrically connected to the second source, wherein the first contact structure is between the first source and the first gate, the second contact structure is between the second drain and the second gate, and the third contact structure is between the second source and the second gate. In an embodiment, the second source, the third source, and the third gate are electrically interconnected within the second semiconductor structure. In an embodiment, the second gate, the third source, and the third gate are electrically interconnected within the second semiconductor structure. In an embodiment, the first gate includes a gate electrode over a layer of p-doped gallium nitride. In an embodiment, the first semiconductor structure includes a silicon substrate, a channel layer over the silicon substrate including gallium nitride, and an active layer over the channel layer including aluminum gallium nitride. In an embodiment, the channel layer has a thickness that is less than 5 μm.

In accordance with some embodiments of the present disclosure, a package includes a first semiconductor structure including a first high electron mobility transistor (HEMT) device formed on a first substrate; a second semiconductor structure including a second HEMT device and a third HEMT device formed on a second substrate, wherein the second semiconductor structure is attached to the first semiconductor structure, wherein the first HEMT device, the second HEMT device, and the third HEMT device are connected in a cascode configuration; a first conductive feature on the first substrate, wherein the first conductive feature penetrates the first substrate to electrically connect to the first HEMT device; a second conductive feature on the second substrate, wherein the second conductive feature penetrates the second substrate to electrically connect to the second HEMT device; and a third conductive feature on the second substrate, wherein the third conductive feature penetrates the second substrate to electrically connect to the second HEMT device. In an embodiment, the package includes a leadframe, wherein the leadframe includes a conductive die pad and conductive leads, wherein the first conductive feature is attached to the die pad. In an embodiment, a first conductive lead is electrically connected to the first conductive feature by the die pad, wherein a second conductive lead is electrically connected to the second conductive feature by a first metal plate, wherein a third conductive lead is electrically connected to the third conductive feature by a second metal plate. In an embodiment, a fourth conductive lead is electrically connected to the third conductive feature by the second metal plate. In an embodiment, the package includes a first heatsink over the first substrate and a second heatsink over the second substrate opposite the first substrate. In an embodiment, the third HEMT device is a diode-connected transistor. In an embodiment, the second conductive feature is electrically connected to a gate contact of the second HEMT device, wherein the third conductive feature is electrically connected to a source contact of the second HEMT device.

In accordance with some embodiments of the present disclosure, a method includes forming a first high electron mobility transistor (HEMT) device on a first semiconductor substrate; forming a first interconnect structure over the first semiconductor substrate, wherein the first interconnect structure is electrically connected to the first HEMT device; forming a second HEMT device and a third HEMT device on a second semiconductor substrate; forming a second interconnect structure over the second semiconductor substrate, wherein the second interconnect structure electrically connects the second HEMT device to the third HEMT device; and bonding the first interconnect structure to the second interconnect structure, wherein the bonding electrically connects the first HEMT device to the second HEMT device and electrically connects the first HEMT device to the third HEMT device. In an embodiment, bonding the first interconnect structure to the second interconnect structure includes forming solder bumps on the first interconnect structure and placing the second interconnect structure on the solder bumps. In an embodiment, the bonding electrically connects a source of the first HEMT device to a drain of the second HEMT device and electrically connects a gate of the first HEMT device to a drain of the third HEMT device. In an embodiment, the method includes forming seal ring structures in the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor structure comprising a first high electron mobility transistor (HEMT) device on a first side of a first substrate, wherein the first HEMT device comprises a first gate, a first source, and a first drain;
   a second semiconductor structure stacked above and bonded to the first semiconductor structure, wherein the second semiconductor structure comprises a second HEMT device and a third HEMT device on a first side of a second substrate, wherein the second HEMT device comprises a second gate, a second source, and a second drain that is electrically connected to the first source, wherein the third HEMT device comprises a third gate, a third source, and a third drain that is electrically connected to the first gate, wherein the first side of the first substrate faces the first side of the second substrate; and
   an underfill sandwiched between the first semiconductor structure and the second semiconductor structure.

2. The semiconductor device of claim 1, wherein the second semiconductor structure is bonded to the first semiconductor structure by a plurality of solder bumps.

3. The semiconductor device of claim 1, wherein the first HEMT device is a depletion mode transistor, the second HEMT device is an enhancement mode transistor, and the third HEMT device is an enhancement mode transistor.

4. The semiconductor device of claim 1 further comprising a first contact structure electrically connected to the first source, a second contact structure electrically connected to the second gate, and a third contact structure electrically connected to the second source, wherein the first contact structure is between the first source and the first gate, the second contact structure is between the second drain and the second gate, and the third contact structure is between the second source and the second gate.

5. The semiconductor device of claim 1, wherein the second source, the third source, and the third gate are electrically interconnected within the second semiconductor structure.

6. The semiconductor device of claim 1, wherein the second gate, the third source, and the third gate are electrically interconnected within the second semiconductor structure.

7. The semiconductor device of claim 1, wherein the first gate comprises a gate electrode over a layer of p-doped gallium nitride.

8. The semiconductor device of claim 1, wherein the first semiconductor structure comprises a silicon substrate, a channel layer over the silicon substrate comprising gallium nitride, and an active layer over the channel layer comprising aluminum gallium nitride.

9. The semiconductor device of claim 8, wherein the channel layer has a thickness that is less than 5 µm.

10. A package comprising:
   a first semiconductor structure comprising a first high electron mobility transistor (HEMT) device formed on a first side of a first substrate;
   a second semiconductor structure comprising a second HEMT device and a third HEMT device formed on a first side of a second substrate, wherein the second semiconductor structure is attached to the first semiconductor structure, wherein the first HEMT device, the second HEMT device, and the third HEMT device are connected in a cascode configuration;
   a first conductive feature extending over a second side of the first substrate, wherein the first conductive feature penetrates the first substrate to electrically connect to the first HEMT device;
   a second conductive feature extending over a second side of the second substrate, wherein the second conductive feature penetrates the second substrate to electrically connect to the second HEMT device; and
   a third conductive feature extending over the second side of the second substrate, wherein the third conductive feature penetrates the second substrate to electrically connect to the second HEMT device.

11. The package of claim 10 further comprising a leadframe, wherein the leadframe comprises a conductive die pad and a plurality of conductive leads, wherein the first conductive feature is attached to the conductive die pad.

12. The package of claim 11, wherein a first conductive lead is electrically connected to the first conductive feature by the conductive die pad, wherein a second conductive lead is electrically connected to the second conductive feature by a first metal plate, wherein a third conductive lead is electrically connected to the third conductive feature by a second metal plate.

13. The package of claim 12, wherein a fourth conductive lead is electrically connected to the third conductive feature by the second metal plate.

14. The package of claim 10 further comprising a first heatsink over the first substrate and a second heatsink over the second substrate opposite the first substrate.

15. The package of claim 10, wherein the second conductive feature is electrically connected to a gate contact of the second HEMT device, wherein the third conductive feature is electrically connected to a source contact of the second HEMT device.

16. A method comprising:
   forming a first high electron mobility transistor (HEMT) device on a first semiconductor substrate;
   forming a first interconnect structure over the first semiconductor substrate, wherein the first interconnect structure is electrically connected to the first HEMT device;
   forming a second HEMT device and a third HEMT device on a second semiconductor substrate;
   forming a second interconnect structure over the second semiconductor substrate, wherein the second interconnect structure electrically connects the second HEMT device to the third HEMT device; and
   bonding the first interconnect structure to the second interconnect structure using solder bumps, wherein a first solder bump electrically connects the first HEMT device to the second HEMT device and a second solder bump electrically connects the first HEMT device to the third HEMT device.

17. The method of claim 16, wherein the bonding electrically connects a source of the first HEMT device to a drain of the second HEMT device and electrically connects a gate of the first HEMT device to a drain of the third HEMT device.

18. The method of claim 16 further comprising forming seal ring structures in the first interconnect structure.

19. The package of claim 10, wherein the first side of the first substrate is closer to the first side of the second substrate than to the second side of the second substrate.

* * * * *